United States Patent
Ohmart et al.

(10) Patent No.: US 9,229,058 B2
(45) Date of Patent: Jan. 5, 2016

(54) DIE ATTACH PICK ERROR DETECTION

(71) Applicant: Texas Instruments Incorporated, Dallas, TX (US)

(72) Inventors: Dale Ohmart, Fulshear, TX (US); Balamurugan Subramanian, Plano, TX (US); Renato Heracleo Orduna Leano, Baguio (PH); Sonny Evangelista Dipasupil, Baguio (PH); Ronald Jay V. Peralta, Baguio (PH)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 368 days.

(21) Appl. No.: 13/926,969

(22) Filed: Jun. 25, 2013

(65) Prior Publication Data

US 2014/0002128 A1    Jan. 2, 2014

Related U.S. Application Data

(60) Provisional application No. 61/664,829, filed on Jun. 27, 2012, provisional application No. 61/665,392, filed on Jun. 28, 2012.

(51) Int. Cl.
*G01R 31/00* (2006.01)
*G01R 31/3185* (2006.01)
*G01R 31/28* (2006.01)

(52) U.S. Cl.
CPC .... *G01R 31/318511* (2013.01); *G01R 31/2831* (2013.01)

(58) Field of Classification Search
None
See application file for complete search history.

(56) References Cited

U.S. PATENT DOCUMENTS

| | | | |
|---|---|---|---|
| 6,380,000 B1 * | 4/2002 | Subramanian .... | H01L 21/67259 257/E23.179 |
| 6,756,796 B2 * | 6/2004 | Subramanian .... | H01L 21/67259 257/E23.179 |

* cited by examiner

*Primary Examiner* — Minh N Tang
(74) *Attorney, Agent, or Firm* — Steven A. Shaw; Frank D. Cimino

(57) ABSTRACT

Embodiments of the invention provide a method to detect pick and place indexing errors on each manufacturing batch (lot) of semiconductor wafer processed during a die attach process using a preselected skeleton of check die. The known locations of the check skeleton die are verified during picking of die from the wafer. If the check skeleton cannot be correctly verified at the known locations, then a pick error is indicated. The embodiments may be implemented on existing die attach equipment.

20 Claims, 23 Drawing Sheets

DIE ATTACH PICK ERROR DETECTION

CLAIM OF PRIORITY UNDER 35 U.S.C. 119(e)

The present application claims priority to and incorporates by reference U.S. Provisional Application No. 61/665,392, filed Jun. 28, 2012, entitled "Method for Die Attach Pick Error Detection." The present application also claims priority to and incorporates by reference U.S. Provisional Application No. 61/664,829, filed Jun. 27, 2012, entitled "Detection Using Pick & Place Index Map and Map Shift".

FIELD OF THE INVENTION

Embodiments of the invention are directed, in general, to semiconductor processing systems and more specifically to die attachment and pick error detection

BACKGROUND OF THE INVENTION

A conventional semiconductor (e.g., silicon) wafer contains a plurality of integrated circuit die, also referred to as chips. Conventional assembly processes such as pick and place use an electronic wafer map that includes information indicative of die attributes such as the exact location of each die on the wafer, and wafer-level probe test results for each die. The wafer map identifies the exact location of each die using a coordinate system that corresponds to the physical structure of the wafer. The probe test results (die quality) may be expressed as a single bit value, e.g., good (accept) or bad (reject), or a multiple bit value that provides additional information such as good first grade, good second grade, etc. The wafer map includes a plurality of bin numbers to categorize various attributes and/or properties of each die. For example, bin 1 may contain identification of all good first grade dice, bin 2 may contain identification of all good second grade dice, bin 3 may contain identification of all plug dice, bin 4 may contain identification of all bad dice, and bin 5 may contain identification of all edge bad dice. Each die may be assigned to a particular bin based on the results of the probe testing.

A wafer map host system receives the map data, provides storage, and enables data download into the production equipment to support processing of wafers to manufacture a semiconductor product. The wafer map host system transforms the lot's wafer map file into a suitable map file for the pick and place equipment to handle and prepares them for equipment download. On the manufacturing floor, as the wafer goes through the assembly process, a barcode may be generated for the wafer identification (ID) and may be attached to the wafer or to a carrier frame. When the wafer is ready to be processed at the pick and place equipment, the frame or wafer ID barcode is scanned and is used to request the wafer map from the wafer map host system. The pick and place equipment uses the downloaded wafer map to directly step to the good chips for pick-up.

At an Assembly/Test (A/T) facility, a wafer undergoes sawing to singulate the dice, and pick and place processing based on the wafer map. A wafer map, which specifies the exact location of all good dice, is used to control an accept/reject function of a typical pick and place system. The Die Attach assembly process depends on automated equipment following a wafer map perfectly to attach only Good Electrical Chips (GEC) to lead frames. Reference die alignment typically happens only at the start of each wafer. Any error that occurs after reference die alignment is complete is generally undetectable and will allow bad die to be mounted on lead frames.

BRIEF DESCRIPTION OF THE DRAWINGS

Particular embodiments in accordance with the invention will now be described, by way of example only, and with reference to the accompanying drawings.

Figure 1:
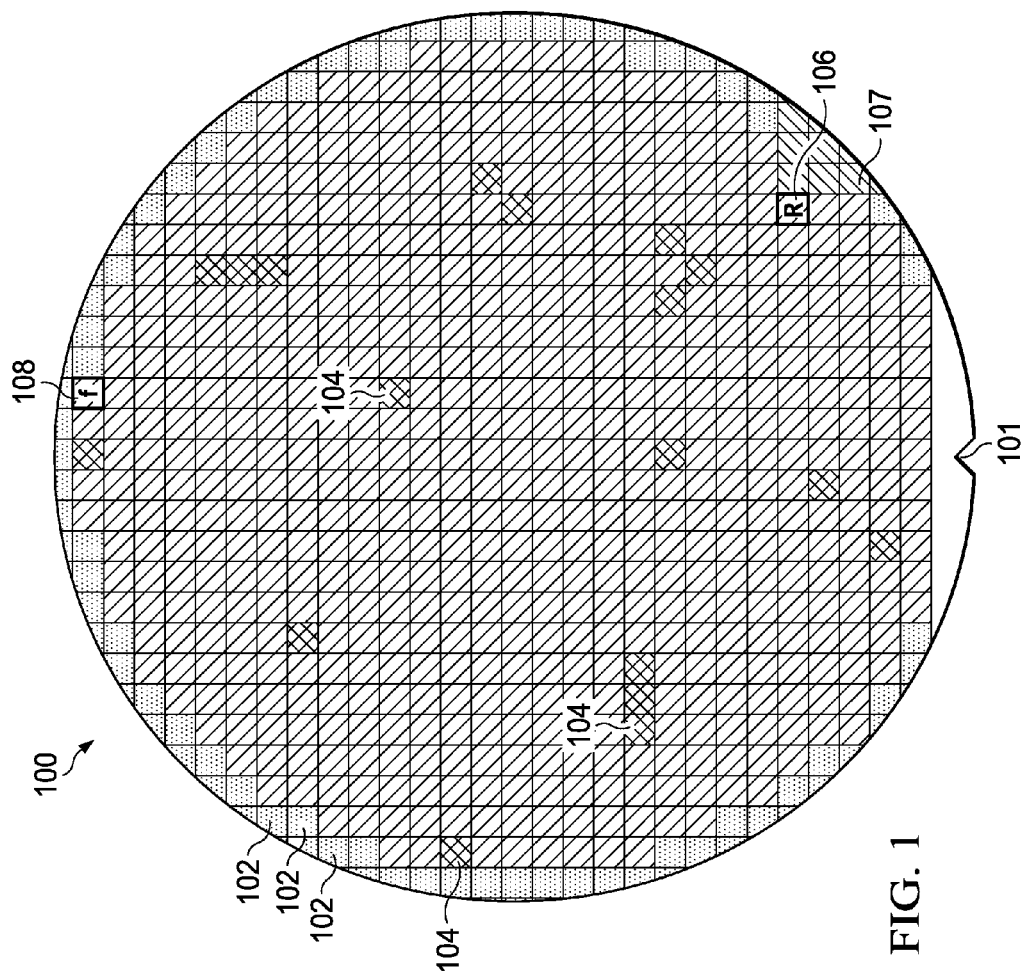
FIG. 1 illustrates an example semiconductor wafer.

Other features of the present embodiments will be apparent from the accompanying drawings and from the detailed description that follows.

DETAILED DESCRIPTION OF EMBODIMENTS OF THE INVENTION

Specific embodiments of the invention will now be described in detail with reference to the accompanying figures. Like elements in the various figures are denoted by like reference numerals for consistency. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Embodiments of the invention are directed, in general, to processing semiconductor wafers and, more particularly, to detecting pick & place index and map shift issues in normal wafer processing. Embodiments of the invention now will be described more fully hereinafter with reference to the accompanying drawings. This invention may, however, be embodied in many different forms and should not be construed as limited to the embodiments set forth herein. Rather, these embodiments are provided so that this disclosure will be thorough and complete, and will fully convey the scope of the invention to those skilled in the art.

During a pick and place operation on a wafer, once all the good die have been picked (that is, removed from the wafer and mounted on lead frames), then the remaining die are in visually unique positions and may be visually inspected to determine if remaining die match the defective die pattern provided by the die map. The set of remainder die on a wafer like this is commonly called a "skeleton wafer." Skeleton checks are not a new idea, but they have previously relied on visual comparison which may often be unreliable because each wafer has a different skeleton pattern.

Embodiments of the invention rely on a preselected check skeleton to provide a reliable verification process. This is done by controlling the check skeleton so that instead of the check skeleton simply being a random collection of reject die left after processing the wafer, this approach pre-selects the desired check skeleton characteristics. This pre-selection can be done to statistically maximize throughput while minimizing the probability of failing to detect a machine alignment error during wafer processing.

FIG. 1 shows an example of a typical semiconductor wafer, where the constituent dice are illustrated as adjacent rectangular shapes in a two-dimensional array of the wafer, but are not shown to actual scale. Larger wafers that are now available may contain hundreds or thousands of die, depending on the size of the die and the size of the wafer. For example, a typical wafer may range in size from a few inches in diameter to twelve inches (300 mm) or more in diameter. A wafer typically contains an orientation marker 101 in the form of a wafer notch. Other examples of orientation markers include a wafer flat, a wafer notch, or similar feature.

A suitable reference feature, e.g., a mirror area, non-circuit die, or other feature that is readily distinguishable visually from an integrated circuit die, is located in a predetermined area of the wafer. In the example of FIG. 1, the reference feature is a mirror die area 107 that occupies an area adjacent a lower right edge of the wafer, close to the flat edge orientation marker. A reference die 106 is located leftward adjacent the mirror die area 107 as shown in the FIG. 1. The aforementioned coordinate system of the wafer map is defined relative to the location of the reference die on the wafer. The spatial relationship between the reference die and the reference feature is known. The reference feature is readily identifiable by its visually distinct appearance and its known spatial relationship to the wafer notch orientation marker. In conventional full wafer processing, the A/T facility equipment uses the reference feature to identify the reference die.

Around the edge of wafer 100 are edge die 102 that are not usable and will be discarded. There may also be a number of die that were determined to be defective by the wafer probe process. In this example wafer a set of defective die are shown as shaded blocks, as indicated generally at 104. The die map generated during wafer probe contains the location of all defective and edge die. Obviously, the location of the defective die may be different on each wafer.

Figure 2:
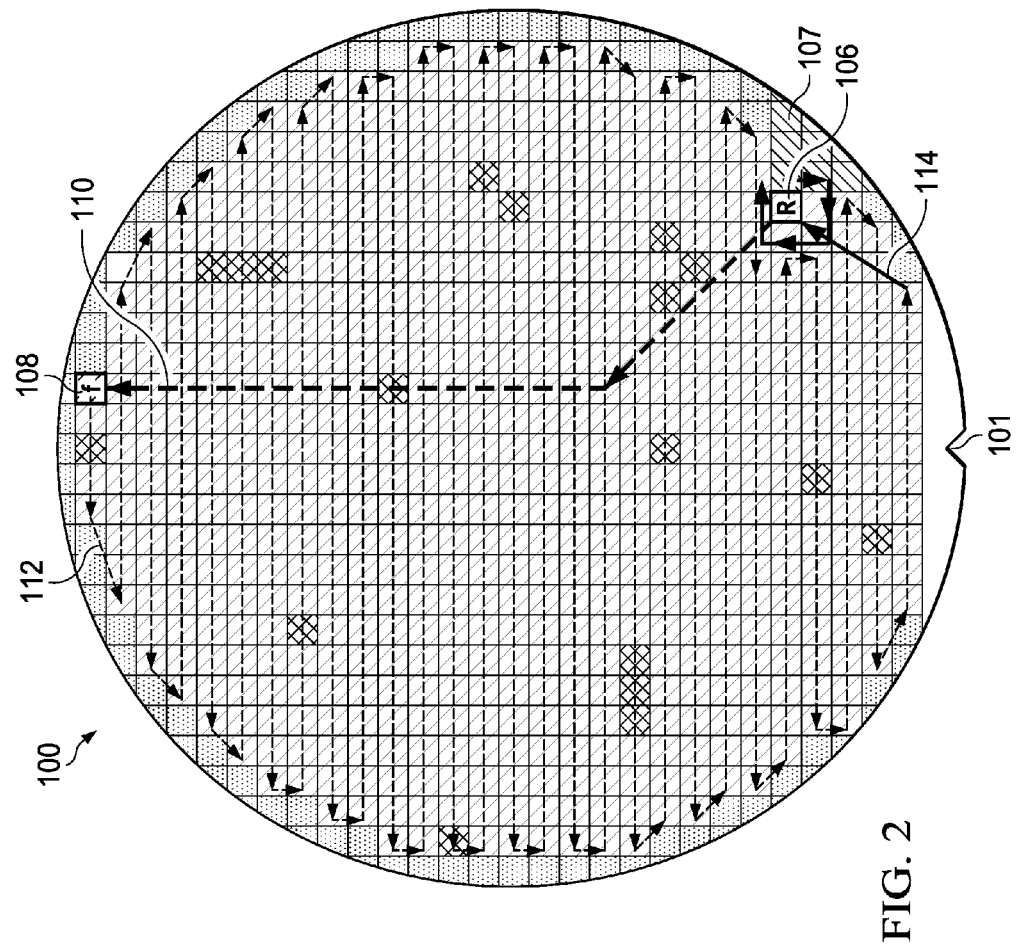
FIGS. 2-6 illustrated various types of pick errors that may occur during processing of the wafer of FIG. 1.

FIG. 2 illustrates a typical pick & place sequence. The pick process begins by loading a wafer on the wafer table of a pick and place station. A wafer map is downloaded from a wafer map host. The position of the wafer table is then adjusted to locate reference die 106 using a well known or later developed reference location procedure, such as, for example, using a nine die neighbor inspection and keying off the mirror die region 107. Once the reference die 106 is located, the wafer table is stepped to the first die to be picked 108 location, as indicated by track 110. Well known or later developed procedures may be used for stepping the wafer table from the reference die 106 location to the first die 108 location. From this point on, the wafer table may be stepped in a serpentine pattern as indicated by track 112 back and forth across the wafer. At each die location, the die is picked and placed if it is a known good die, based on the wafer map, or it is left if it is a known defective die, based on the wafer map. After picking all of the known good die, the wafer table is again stepped to the location that is believed to be the reference die, as indicated by track 114. If the reference die is verified as being correct, by using known or later developed techniques, then this is an indication that the entire wafer has been picked correctly.

Figure 3:
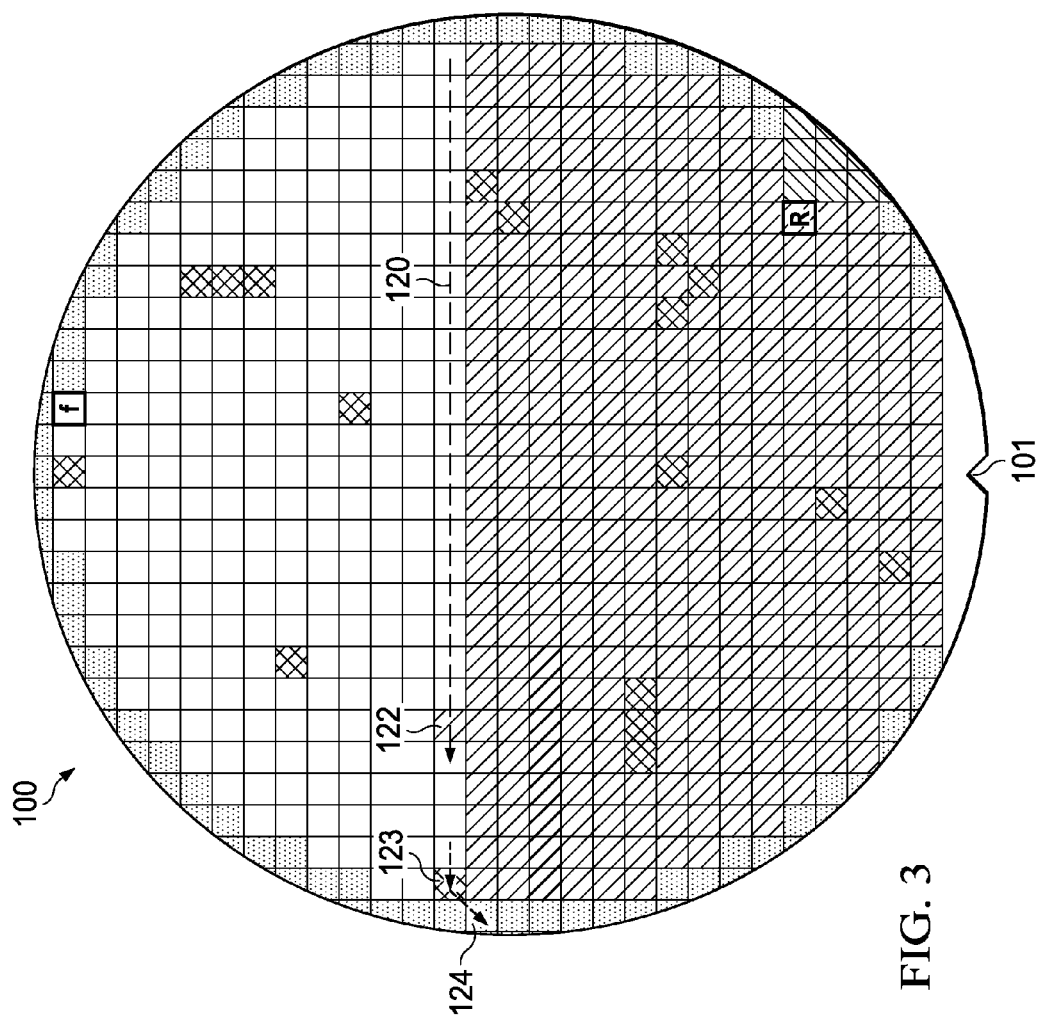
Figure 4:
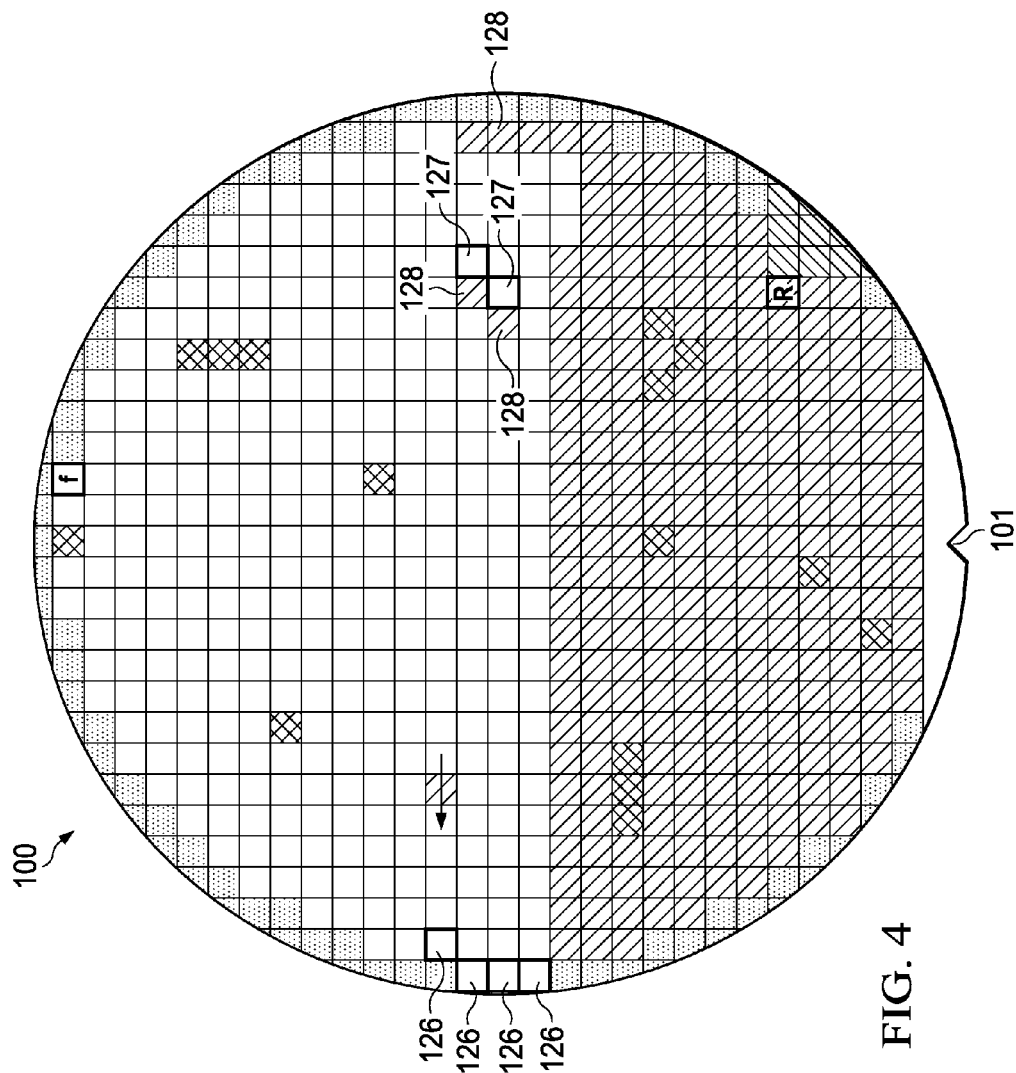

FIGS. 3 and 4 illustrate a common type of error that may occur during picking of wafer 100. In this example, while the wafer table is stepping along track 120, it may incorrectly jump two die positions instead of one, as illustrated at die location 122. This double jump will essentially cause the wafer table to be shifted one die position to the right which in turn causes the die map to be shifted on die position to the left. This map shift will then result in leaving good die 122, and picking bad die 123 and edge die 124, for example.

FIG. 4 illustrates how a map shift to the left results in numerous pick errors. For example, bad die indicated at 126 and 127 are picked, while good die indicated at 128 are not picked. These types of errors may continue for the entire pick process and may result in scrapping the entire assembly lot or requiring testing to sort out the bad packaged die.

Figure 5:
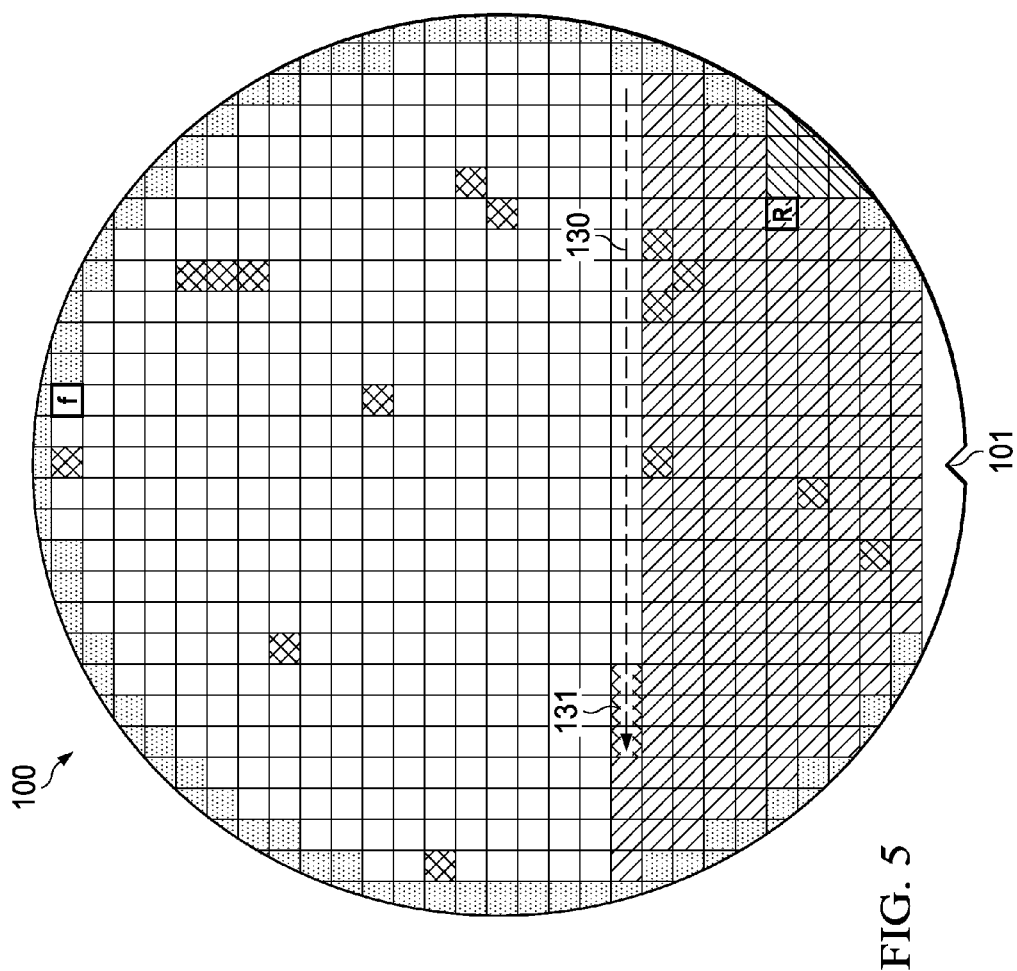
Figure 6:
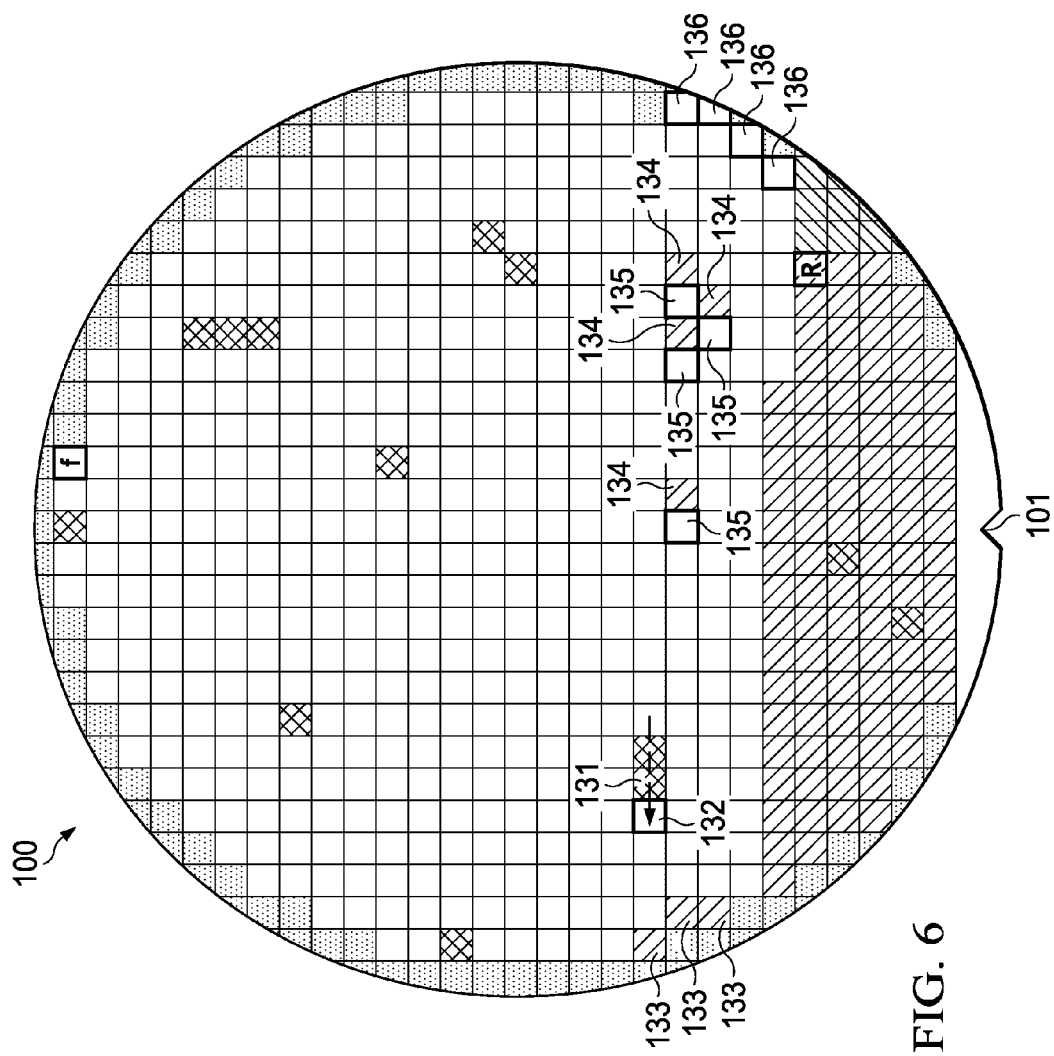

FIGS. 5 and 6 illustrate a short jump and map shift to right. In this example, while stepping along track 130, the die map indicates three bad die 131. The wafer table attempts to skip over the three bad die positions, but may in fact only skip two positions. This results in bad die 132 being picked and essentially shifting the map table right one position.

FIG. 6 illustrates how the map shift to the right results in numerous pick errors. For example, bad die indicated at 135 and 136 are picked, while good die indicated at 133 and 134 are not picked. These types of errors may continue for the entire pick process and may result in scrapping the entire assembly lot or requiring testing to sort out the bad packaged die.

FIGS. 7-15 illustrate a process of using a predefined set of check GECs to quickly determine if a pick error occurs during processing of the wafer 100. As described briefly above, embodiments of the invention predefine a known check skeleton using a set of check die. Each check die is a good electrical chip (GEC), based on the die map. Check GEC (CGEC) dies are selected based on a algorithm, as will now be described in more detail.

The Check GEC die algorithm is intended to generate CGEC dies for a given wafer that will allow the wafer to be processed on various types of pick & place equipment. This enables the wafers to be moved from one piece of equipment to another if required.

Figure 7:
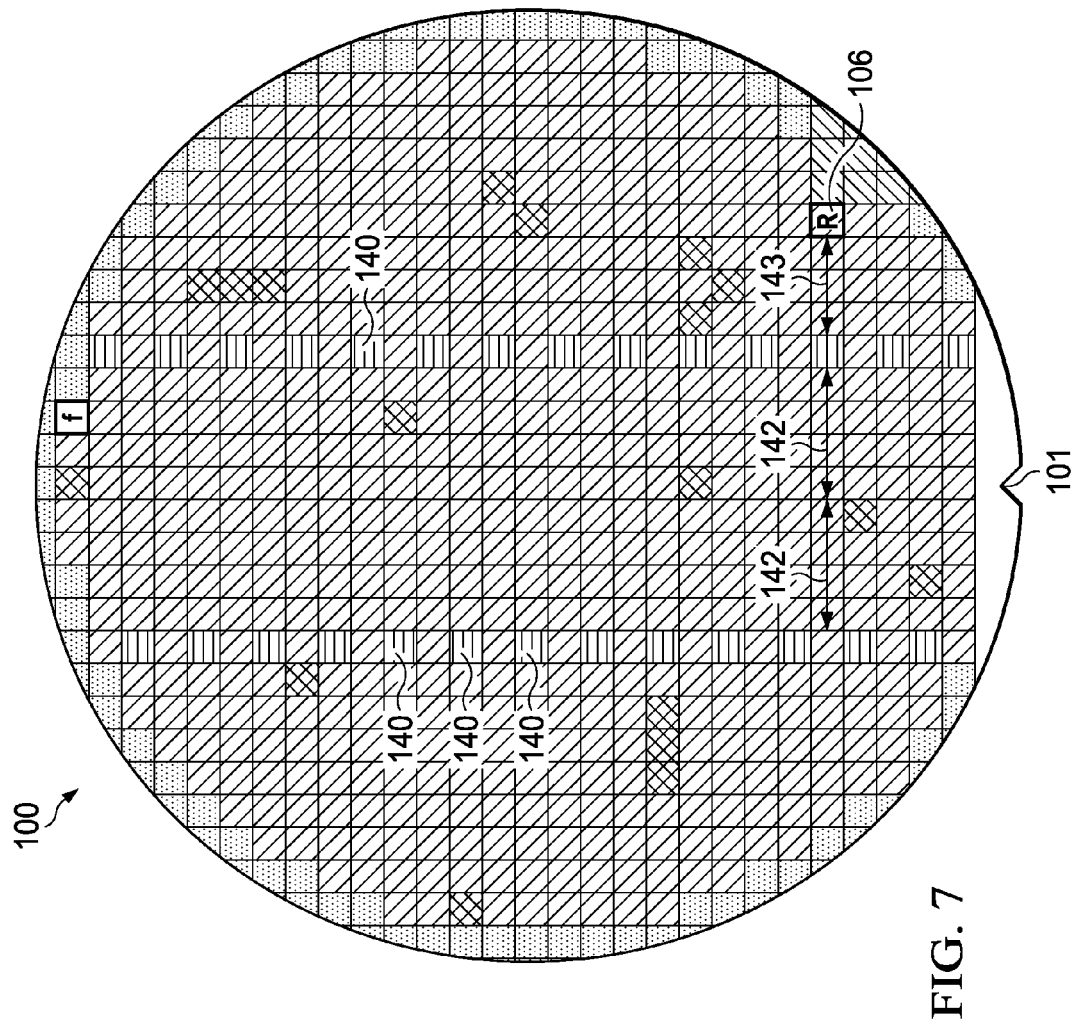
FIGS. 7-14 illustrate a process of using a predefined set of check GECs to quickly determine if a pick error occurs during processing of the wafer of FIG. 1.

FIG. 7 illustrates a simple algorithm for generating CGEC dies in which a CGEC 140 is selected for each row of the wafer, and the selected CGECs are aligned in two columns. The columns are placed in known positions, such as equidistant 142 from a centerline of the wafer and a known distance 143 from reference die 106, for example. In this example, distance 142 is four die positions from the centerline and distance 143 is three die positions from reference die 106. Of course, distance 142 and 143 may vary depending on wafer size and die size. In this algorithm, if a bad die happens to be in a location that is selected for a CGEC, then that CGEC is omitted. Once the CGEC map is determined, it is stored for use by the pick and place operation.

Figure 8:
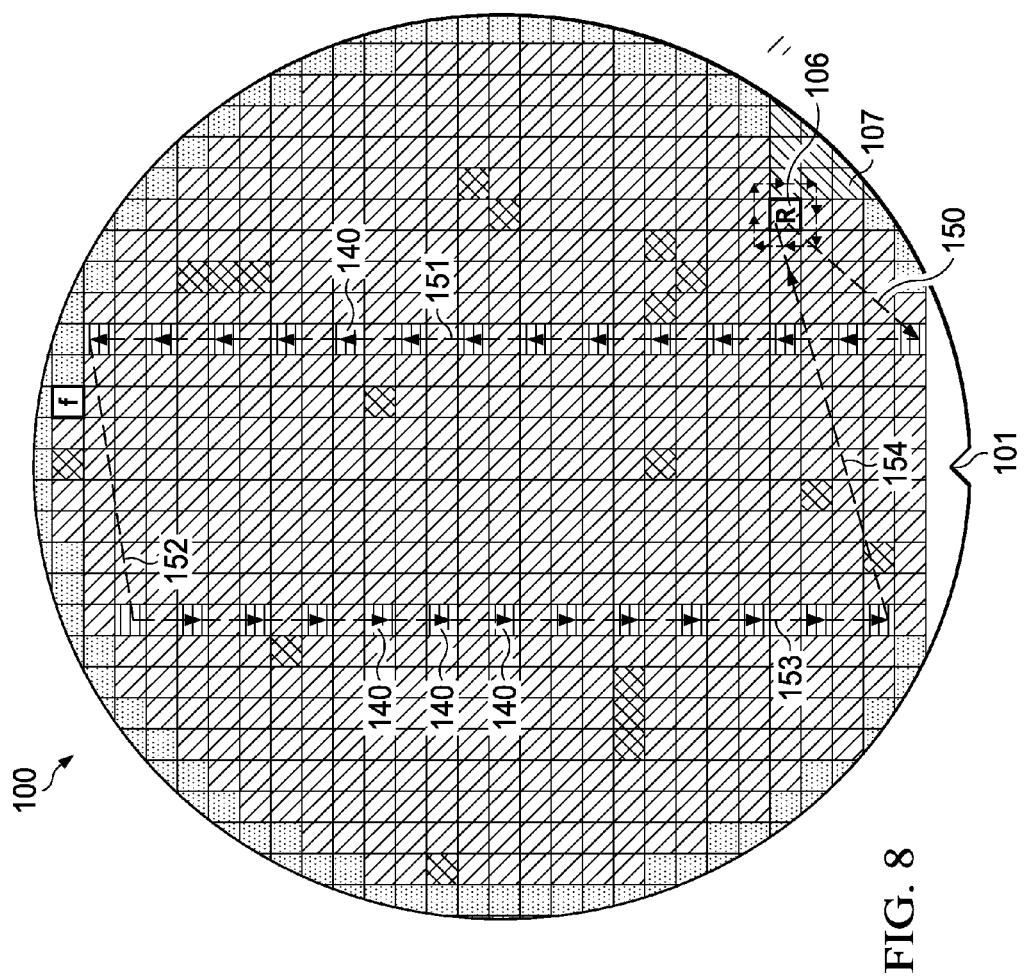

FIG. 8 illustrates picking and placing the CGEC dies in a closed loop. As described above, wafer 100 is loaded onto a wafer table. The wafer table is indexed to locate reference die 106 using a known or later developed reference die locating procedure. The wafer table is then indexed along track 150 to a first one of the set of CGEC die 140 and that CGEC die is picked. The wafer table is then indexed along track 151, 152 and 153 until all of CGEC dies 140 have been picked and placed. This pick and place operation should complete correctly since the wafer has all dies in place and the CGEC map is known. However, as a check the wafer table may again be indexed to the location of reference die 106 along track 154 and a correct location can then be confirmed by searching the neighborhood of reference die 106 using a nine die circumnavigation or other known or later developed procedure.

Figure 9:
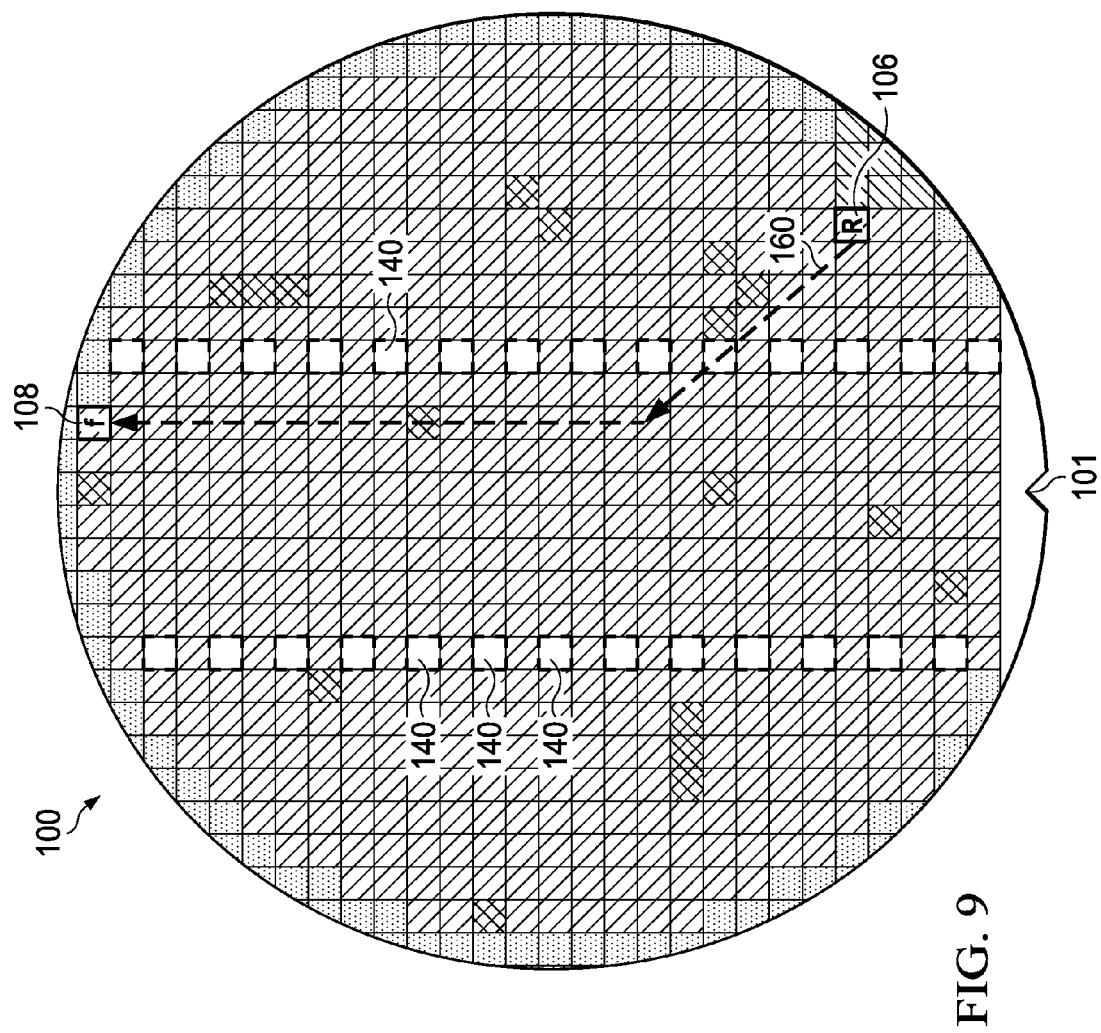

FIG. 9 illustrates wafer 100 after all of the CGEC 140 dies have been picked and placed. The wafer table is now moved from reference die 106 along track 160 to the first die to be picked location 108.

Figure 10:
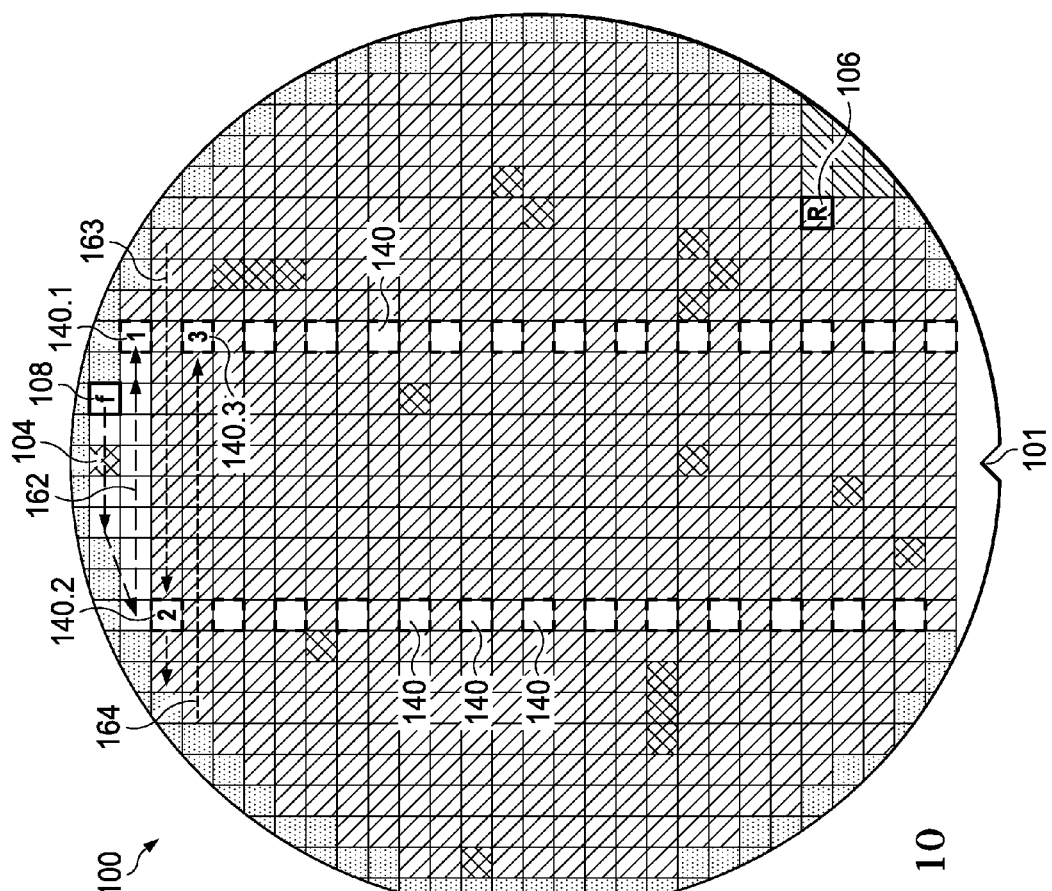

In FIG. 10, a normal pick and place serpentine track is followed as the wafer table is indexed along track 162, picking and placing good die and skipping over bad die, such as bad die 104. Picking and placing continues until the location of CGEC 140.1 is reached. At this point, based on the stored CGEC map, the pick and place alignment system should give an error indicating that a die is not present, since all of the CGEC die were previously picked. In some embodiments, a further nine die neighborhood check, or other known or later developed process, may be performed to verify the location of CGEC die position 140.1. Picking and placing continues along track 163 with a verification of CGEC position 140.2, along track 164 with a verification of CGEC position 140.3, and etc. until the end of the wafer or the end of the lot is reached. Each time a CGEC die location is correctly encountered and identified, it may be assumed that no wafer table indexing errors have occurred. However, if a CGEC location is not confirmed, then an index error may be assumed, as will be described in more detail below.

Figure 11:
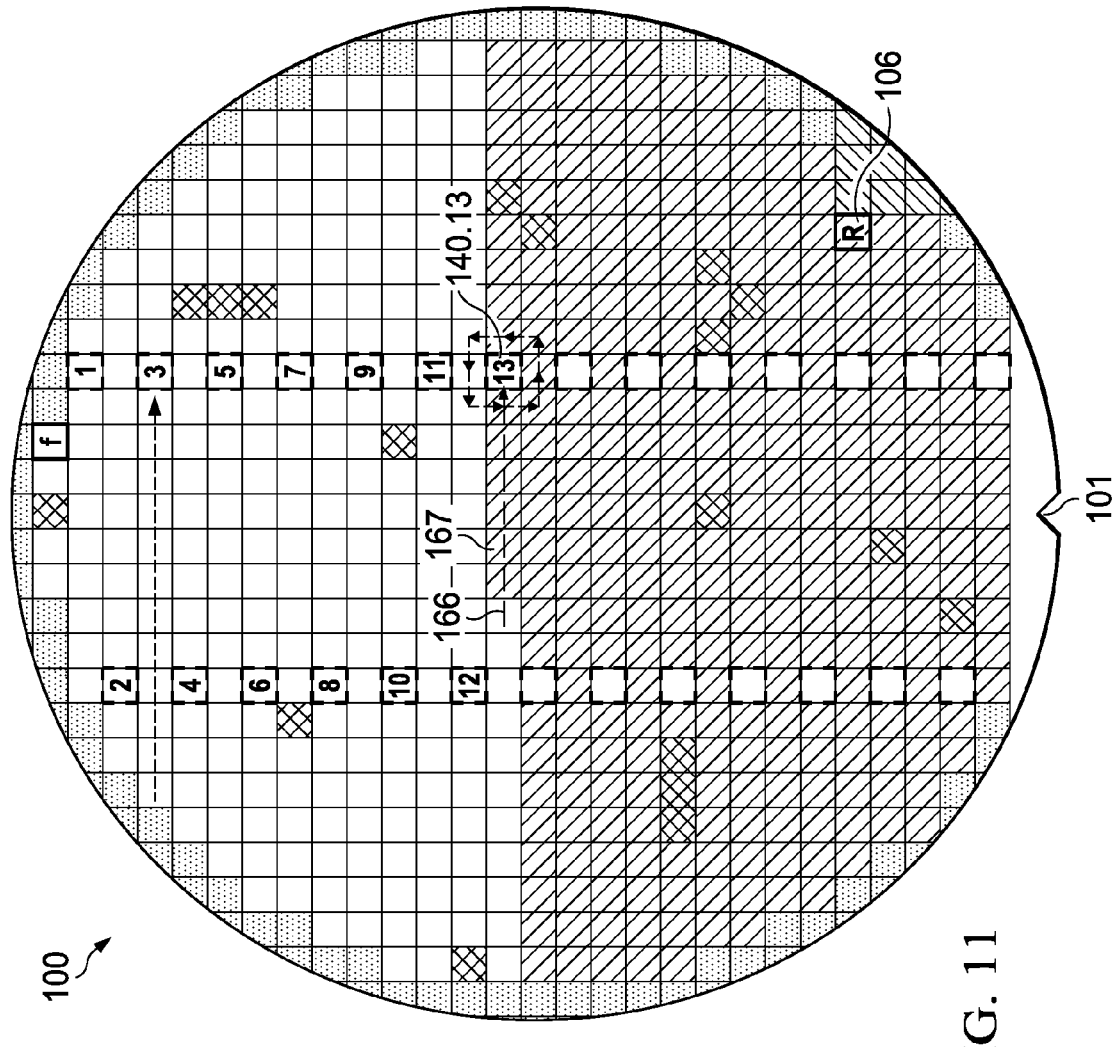

FIG. 11 illustrates an End of Lot occurrence at die location 166. In order to verify correct indexing operation, the wafer table may be stepped along track 167 to known CGEC location 140.13. A "no die present" indication should then be received from the pick and place alignment system. Otherwise, an indexing error is indicated. As mentioned above, further CGEC location confirmation may be performed by a nine die neighborhood search, or other known or later developed location confirmation process. If CGEC die location 140.13 is correctly reached, then it may be assumed that the lot was processed correctly. If there is another lot on wafer 100 to be processed, then the wafer table may be indexed to the beginning of the lot and processed as described above.

Figure 12:
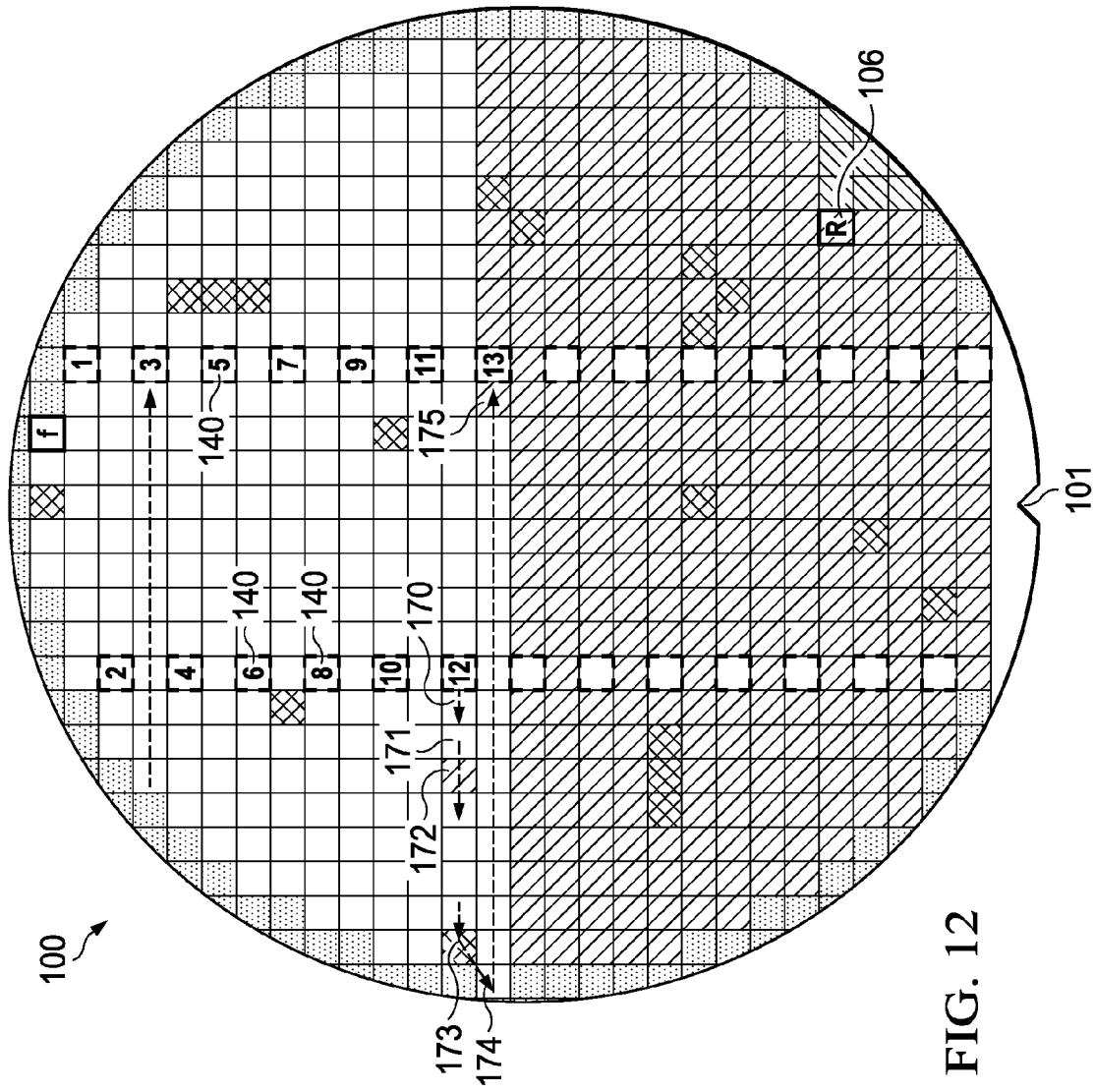

FIG. 12 illustrates an example of when an extra jump occurs during indexing. The results of this type of indexing error were described above with regard to FIGS. 3-4. In this example, CGEC 12 was correctly identified and the pick and place process is indexing along track 170. At die position 171, the wafer table should index to pick die location 172 but instead an inaccurate jump may move the wafer table to the next die position to the left of die 172. In this example, bad die 173 and edge die 174 are incorrectly picked.

As the pick sequence continues, the wafer table will be indexed to die position 175. At this point, the alignment system is expecting a "no die present" indication because the wafer map indicates it is at CGEC 13. However, because of the indexing error, there is a die present. This allows the indexing error that occurred at die location 172 to be detected. All of the die that were picked after CGEC 12 are now suspect and may need to be discarded or retested. If they had been stored in pick sequential order, they may be compared to the die map and the defective parts may be identified based on their sequence position, for example.

Figure 13:
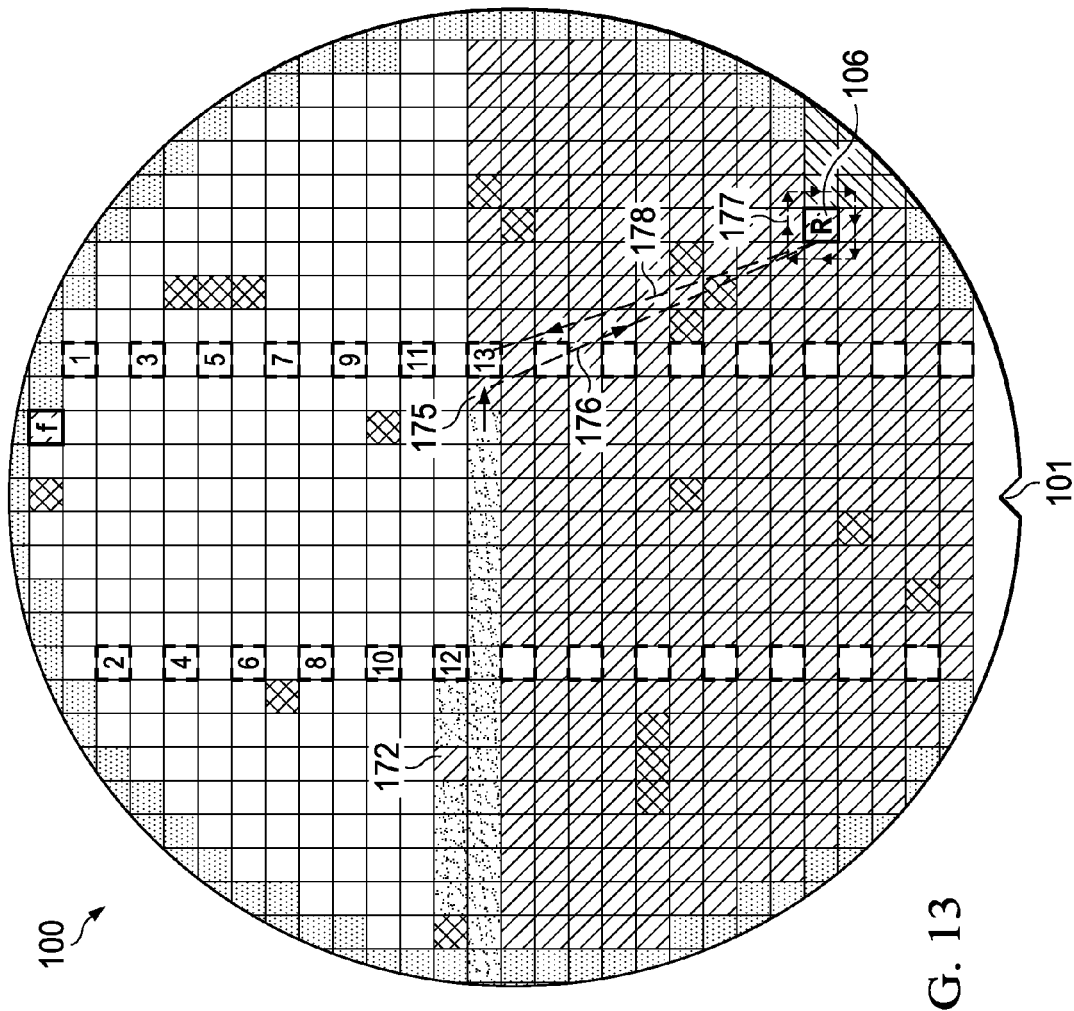

FIG. 13 illustrates how alignment may be recovered after detecting an alignment error. In this example, an alignment error was detected because the alignment system did not detect missing CGEC 13 when is stopped at location 175. After stopping pick and place operation due to the detected error, the wafer table may be moved along track 176 to reference die 106 in order to reorient the wafer table. Due to the index error, manual intervention by an operator may be required to correctly locate reference die 106. A nine die neighborhood survey 177, or other known or later developed position recognition process, may be performed to verify that the wafer table is correctly positioned at reference die 106

Once the wafer table is correctly oriented at reference die 106, the wafer table may then move back to CGEC 13 along track 178 and then continue the pick and place operation. In this manner, only the die that were picked between CGEC 12 and CGEC 13 are suspect. All of the rest of the die in the lot may be assumed to have been correctly picked.

Figure 14:
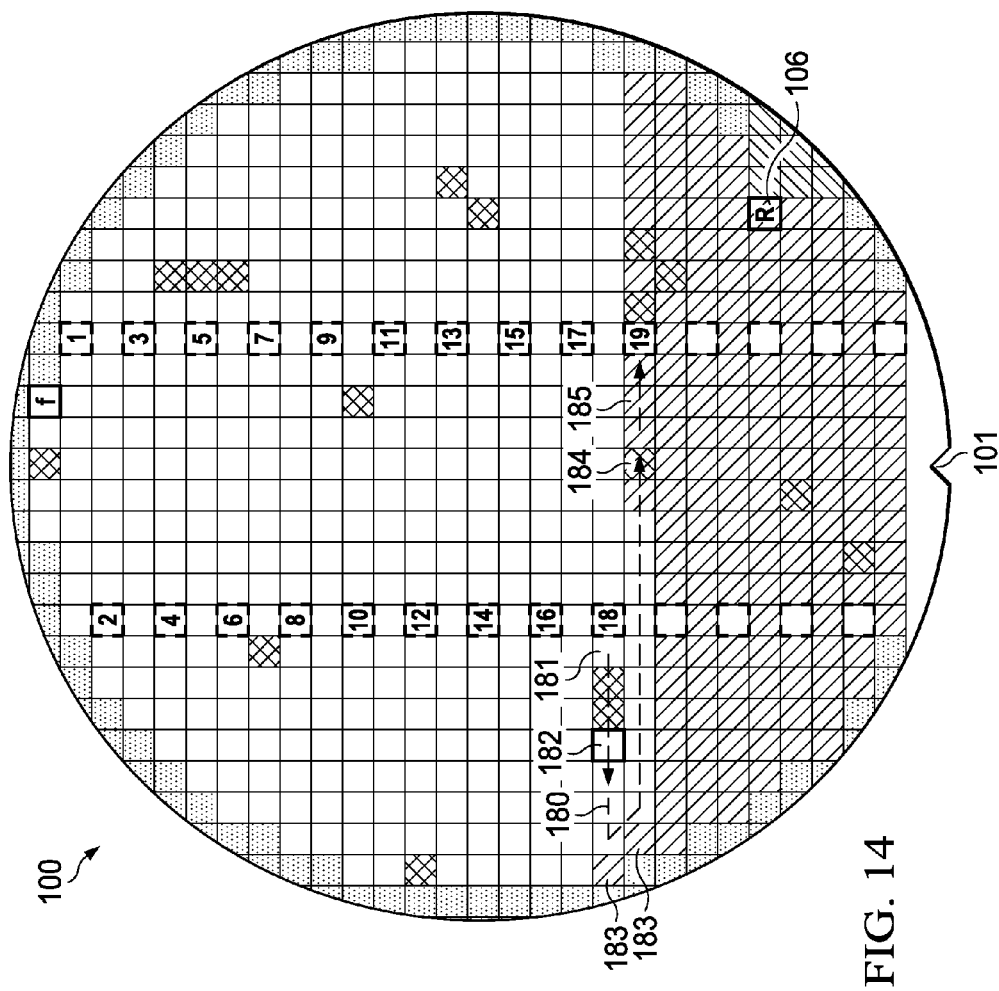

FIG. 14 illustrates an example of when a short jump occurs during indexing. The results of this type of indexing error were described above with regard to FIGS. 5-6. In this example, CGEC 18 was correctly identified and the pick and place process is indexing along track 180. At die position 181, the wafer table should skip three bad die as indicated by the die map but instead an inaccurate jump may move the wafer table only two locations to die position 182, which is a known defective die. As the wafer table continues along track 183, bad die 182 is incorrectly picked and good die 183 are not picked due the index shift.

As the picking continues, bad die 184 will be picked and the good die to the left of it will not be picked. When the wafer table reaches CGEC 19, the alignment system will report an unexpected "missing die," which is not expected until the next die position according to the die map. This allows the indexing error that occurred at die location 182 to be detected. All of the die that were picked after CGEC 18 are now suspect and may need to be discarded or retested. If they had been stored in pick sequential order, they may be compared to the die map and the defective parts may be identified based on their sequence position, for example.

After stopping the pick and place operation due to the detected error, the wafer table may be moved to reference die 106 in order to reorient the wafer table, as was described with regard to FIG. 13. Due to the index error, manual intervention by an operator may be required to correctly locate reference die 106. A nine die neighborhood survey, or other known or later developed position recognition process, may be performed to verify that the wafer table is correctly positioned at reference die 106

Once the wafer table is correctly oriented at reference die 106, the wafer table may then move back to CGEC 19 and then continue the pick and place operation. In this manner, only the die that were picked between CGEC 18 and CGEC 19 are suspect. All of the rest of the die in the lot may be assumed to have been correctly picked.

Figure 15:
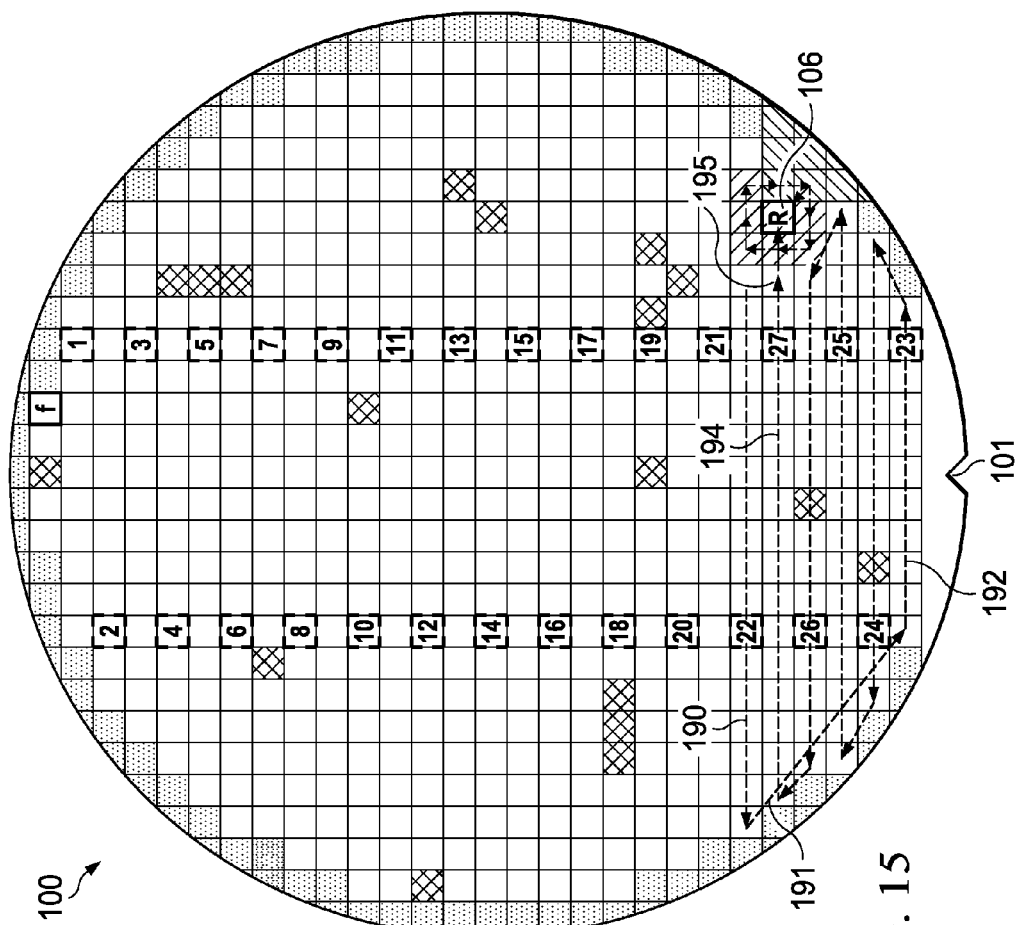
FIG. 15 illustrates a technique to further improve verification accuracy.

FIG. 15 illustrates a technique that may be used to further improve verification of pick accuracy. As the pick process progresses to the end of the wafer, reference die 106 and the nine die in its neighborhood 195 are not picked. Picking continues along track 190, but then moves down track 191 to the edge of the wafer, and then resumes picking along track 192 which continues in a serpentine manner up to track 194. CGEC die locations 22-27 are used to verify correct indexing as described above.

Once CGEC 27 has been reached, then picking continues to reference die 106. Before picking the nine die neighborhood 195, final verification of reference die location 106 is performed using a nine die neighborhood search or other known or later developed verification process. After a successful reference die verification, the reference die and its neighborhood 195 are picked to complete the wafer.

Figure 16:
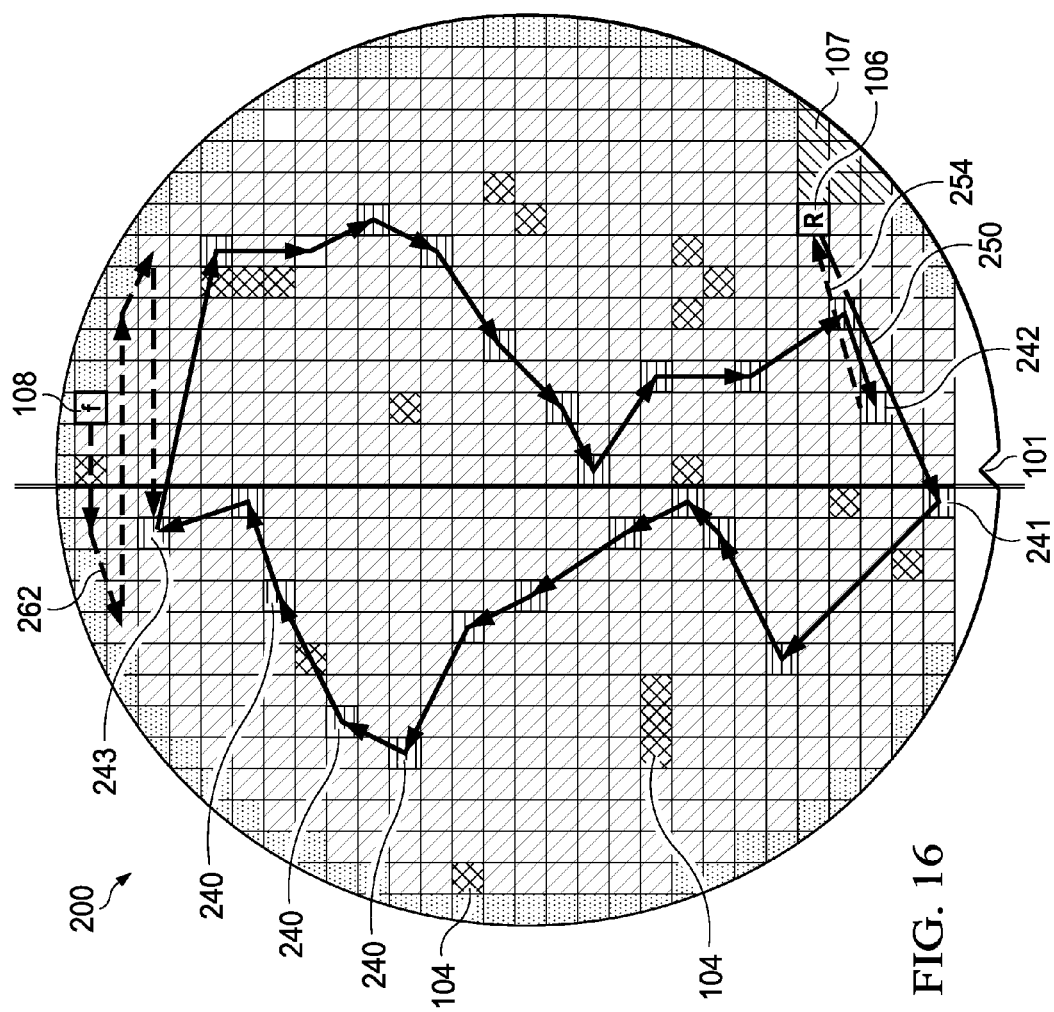
FIGS. 16-20 illustrate alternative arrangements of check GECs.

FIG. 16 illustrates an alternative arrangement of CGEC 240 on wafer 200. In this example, CGEC are selected to occur in a fixed ratio N to the number of dies. For example, in this example N=25 and there is one CGEC for every 25 GEC dies. The CGEC locations are selected so that there are twenty five GEC die sequentially located along the pick track between each CGEC. As described for wafer 100, pick processing begins with moving the wafer table to reference die location 106. After verifying correct location of reference die 106, the wafer table is moved to first CGEC 241 along track 250. After picking CGEC 241, the wafer table is moved to pick each successive CGEC until all CGEC 240 have been picked and stops at CGEC 242. The wafer table is again moved to reference die 106 and the location is verified using a nine die neighborhood search or other known or later developed verification process. After a successful reference die verification, the wafer table is moved to begin picking GEC at first die location 108 and then along track 262 until CGEC location 243 is encountered. At this point, a "missing die" should be reported by the alignment system. Picking and CGEC checking may continue as was described above for example wafer 100. In this manner, a fewer number of CGEC may be required, but no more than N dies will be suspect when an alignment error is detected at any CGEC location.

Figure 17:
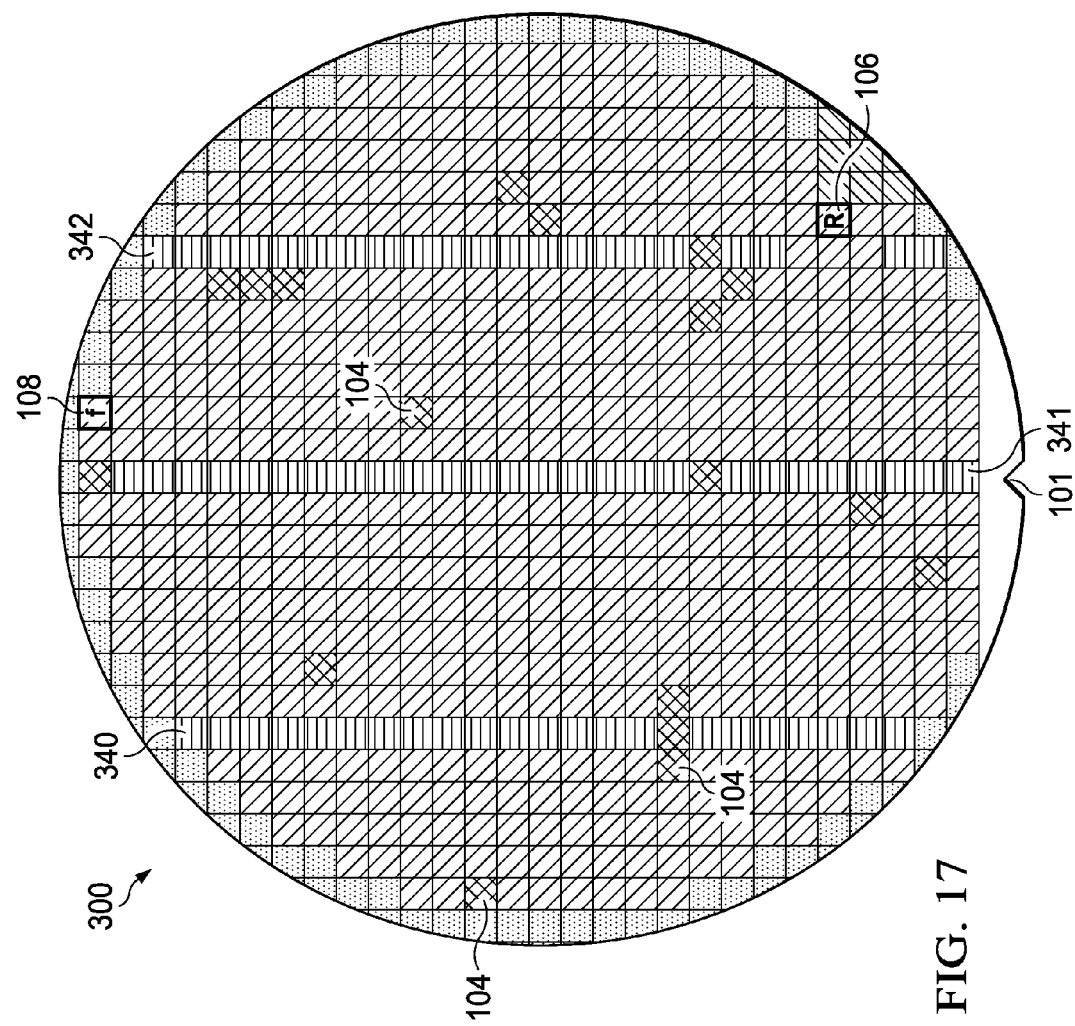

FIG. 17 illustrates an alternative arrangement of CGEC arranged in three columns 340-342 on wafer 300. Picking and CGEC checking may be performed as described above. In other embodiments, a larger number of columns may be used, depending on wafer size and the number of die on the wafer.

Figure 18:
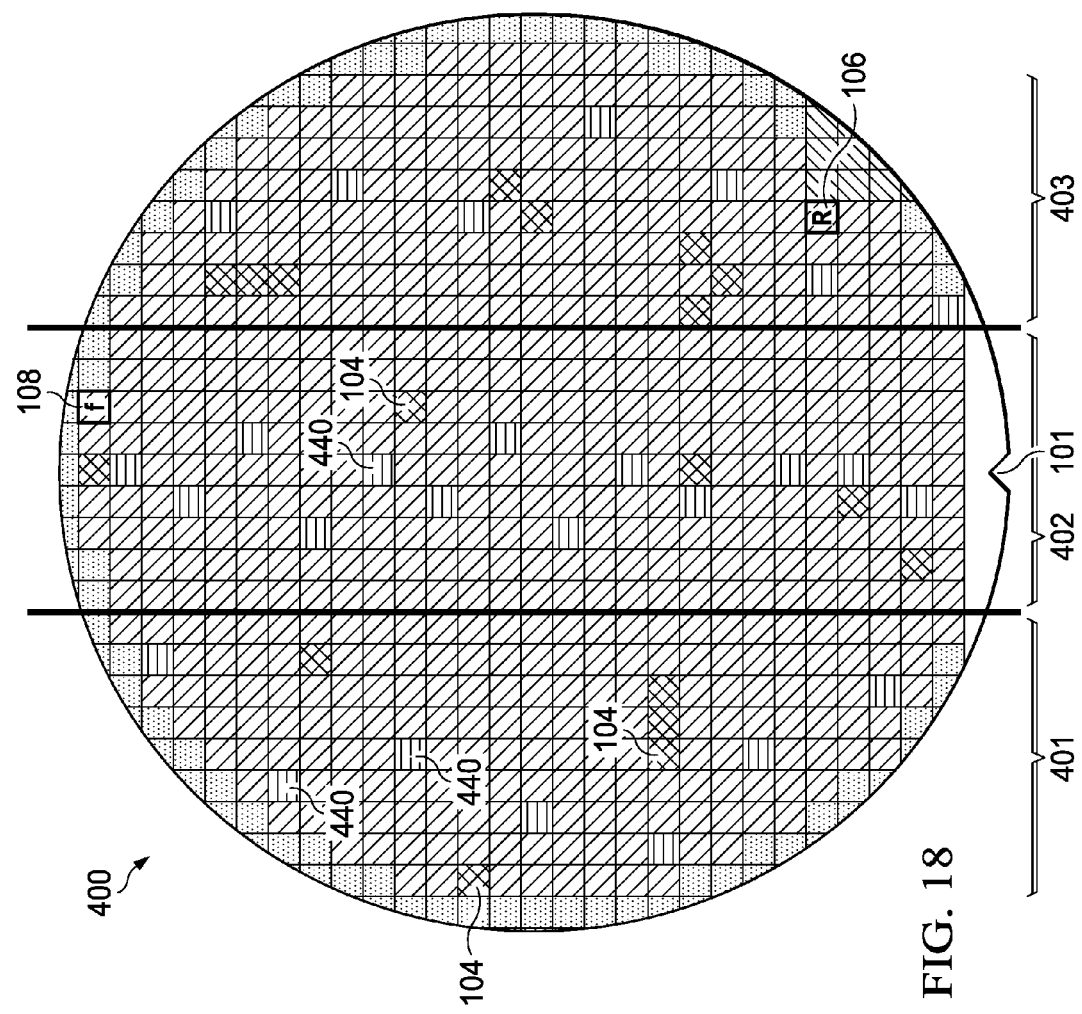

FIG. 18 illustrates an alternative arrangement of CGEC on wafer 400. In this example, there is one CGEC for every row of GEC, but they are arranged in three different regions 401-403 on the wafer. The CGEC are assigned to each region in a manner so as to provide an approximately equal density of CGEC in each region. Picking and CGEC checking may be performed as described above. In other embodiments, a larger number of regions may be used, depending on wafer size and the number of die on the wafer.

Figure 19:
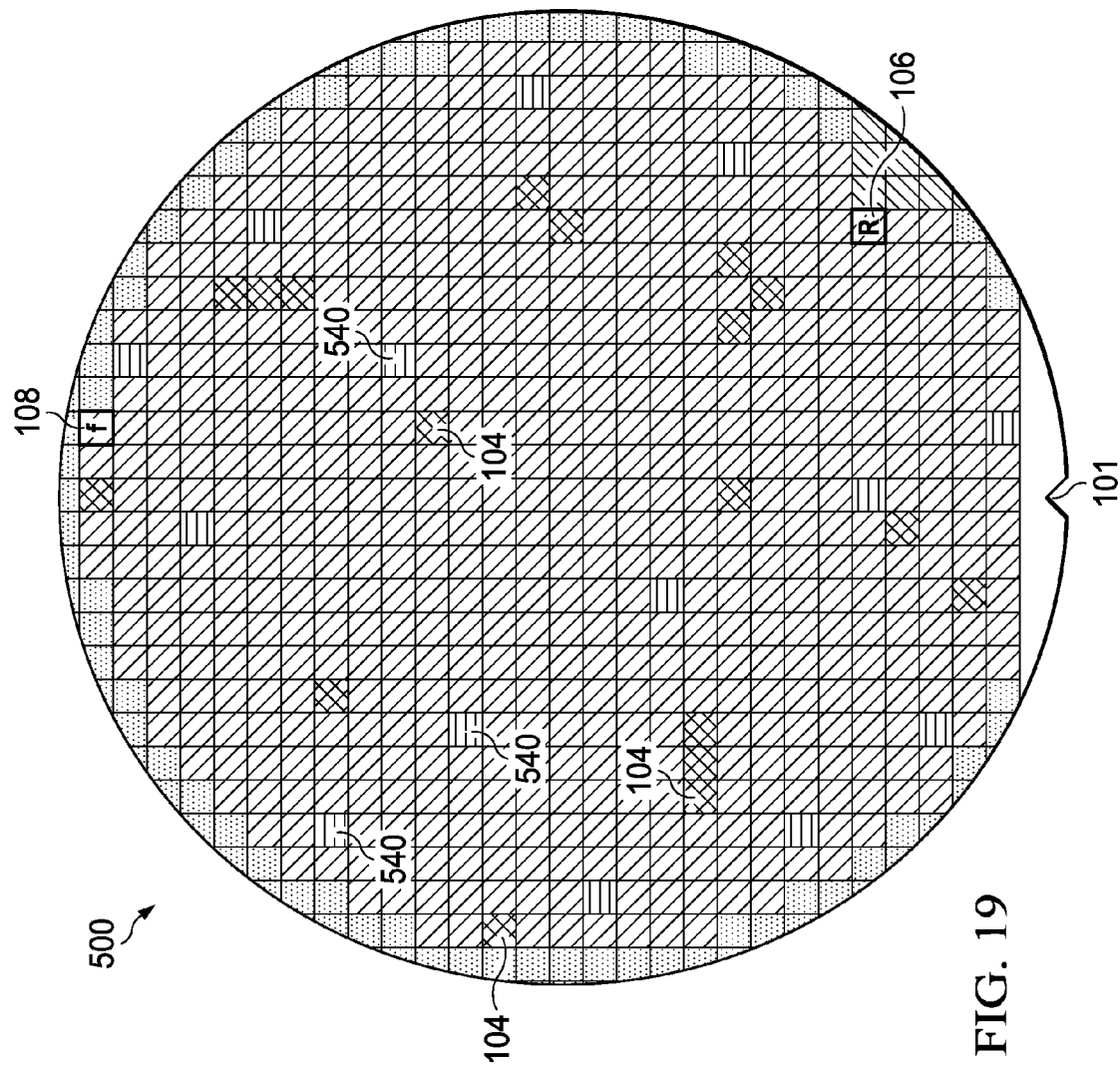

FIG. 19 illustrates an alternative arrangement of CGEC on wafer 500. In this example, there is fixed number M of CGEC 540 distributed across the wafer. M may be selected based on a statistical analysis that may specify a minimum number of CGEC for a given process yield, for example. Such a statistical analysis will be described in more detail below. Picking and CGEC checking may be performed as described above.

In another embodiment, M may be selected based on experience with a given process. For example, if errors occur more often in a particular region of a wafer, then more CGEC may be selected for that region.

Figure 20:
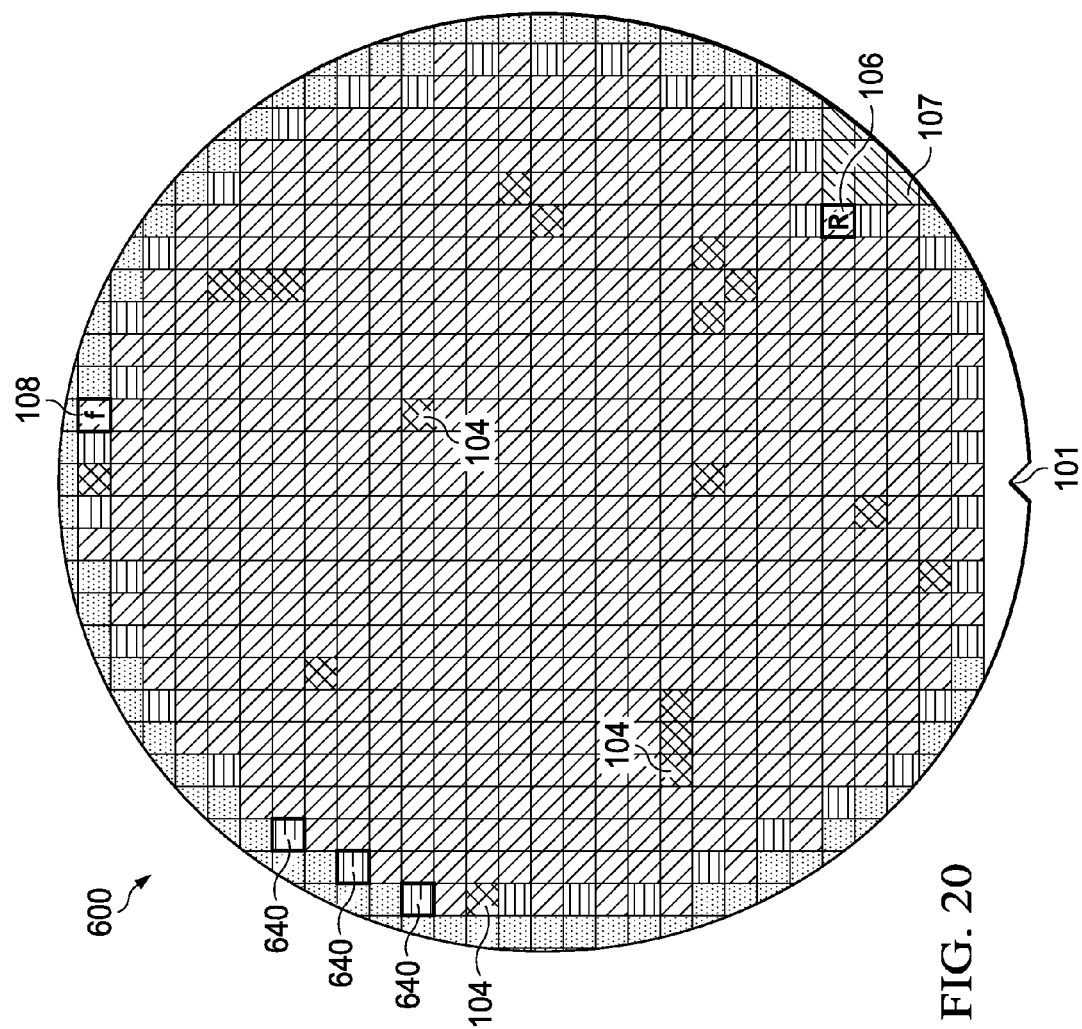

FIG. 20 illustrates an alternative arrangement of CGEC on wafer 600. In this example, CGEC 640 are arranged around the outside of the wafer in a more or less checkerboard arrangement. A checkerboard pattern allows accurate indexing when picking the CGEC, but still allows the set of CGEC to be traversed in a reasonable amount of time. Picking and CGEC checking may be performed as described above.

Statistical Selection of CGEC

Pick errors are caused by incorrect stepping without realizing it. The error may be a machine error or an operator error, such as a wrong reaction to a stop, manual re-selection of "next die," etc. Incorrect stepping may be in any direction. All verifications should be able to observe an error in any of the four directions of movement by the wafer table, referred to as: east, west, north or south. Check die may only detect shift errors in a direction that would not cause an exclusion die to be observed instead. For example, an expected "blank" check space could be filled with REJECT die. Therefore, there is a yield-percent probability of detecting a directional error on each of the verification die.

A minimum number of verification die required is a function of probe yield and of die size. In calculating the number of verification die, it may be assumed that each potential check verification die has two neighboring exclusion die, and two neighboring "FIELD" die. The probability of detecting an error on each check die is a function of yield.

For example, assume a verification check die with West and South neighbors being exclusion die. Assume probe yield is 90%. The probability of detecting a North error=0.9, and the probability of detecting an East error=0.9. If the error is N or E, then there is a 90% chance of detecting it. Since there is a 50% chance the error will be W or S, which is undetectable on this die, the probability (P1) of detecting an actual single error on this die is given by equation (1)

$$P1=(1-0.9)/2=45\%  \qquad (1)$$

The probability of detecting a one-direction error on one die that can observe that error is the probability that the adjacent die was picked. This is approximately equal to the Probe Yield. Therefore, the probability (P2) of detecting a one-direction shift using multiple verification check die is given by equation (2).

$$P2=1-(1-MPY)**N \qquad (2)$$

where N is the number of verification die on which an error in the direction is observable, and MPY is the multi-probe process yield. (percentage of die on the wafer that were identified as good at multi-probe)

Similarly, the probability (P3) of MISSING a shift using N verification check die is given by equation (3)

$$P3=(1-MPY)**N \qquad (3)$$

For example, for an error rate of less than 100 DPPM (defective parts per million) chances of "missing" an error on 75% yield material, then in equation (3), 100/1,000,000>= (1−0.75)**N. Solving for N yields a minimum number of verification check die to be N=7.

Obviously, more than the minimum number of check die may be preselected to allow quicker identification of an alignment error and thereby minimize the amount of processed die that may need to be scrapped or rescreened.

Error Detection Process

Figure 21:
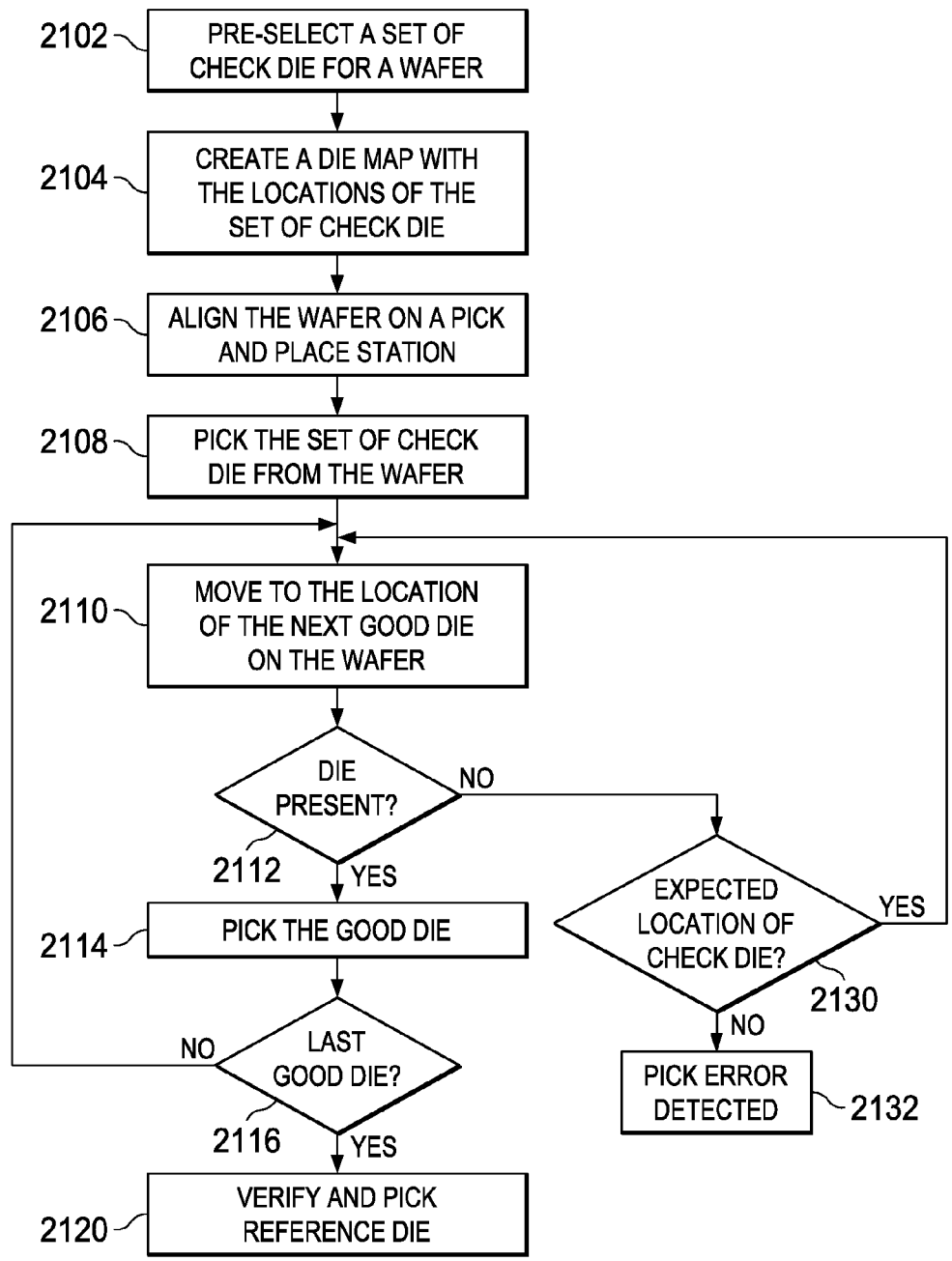
FIG. 21 is a flow diagram illustrating the pick error detection process of FIGS. 2-15.

FIG. 21 is a flow diagram illustrating the pick and place error detection process of FIGS. 7-14. Initially, from good electrical chips (GEC) on a wafer a set of check GEC (CGEC) die is preselected 2102. Typically, this would be done in offline processing using a die map created from pass/fail data provided by a die probe station after probing the wafer. A second die map may be created 2104, or the initial pass/fail map may be augmented to show the locations of the preselected set of CGEC die.

The wafer is then loaded onto a wafer table of a pick and place station and aligned 2106 using a reference die as described in more detail above. Once the wafer is aligned with the pick head, the wafer table moves to the location of the first CGEC and then picks 2108 the entire set of CGEC die as described above with regard to FIG. 8, for example.

Once the set of CGEC die have been picked, then the wafer table moves 2110 to the first GEC die to be picked. As long as the alignment system indicates a die is present 2132, the GEC die is picked 2114 and the wafer table moves 2110 to the next GEC along a preplanned serpentine pick track, as described in more detail above.

Each time the wafer table is moved 2110 to a location that held one of the CGEC die, the alignment system should detect 2112 "no die present" because all of the CGEC were picked first leaving an empty CGEC die skeleton on the wafer. As long as the "no die present" indication occurs 2130 at an expected check die location based on the map of the set of preselected CGEC, then picking may proceed. However, if the "no die present" indication occurs 2130 at a non-expected location, then this indicates an error 2132 due to the wafer table becoming misaligned due to an incorrect movement 2110 and pick errors may have occurred.

Once the last GEC 2116 has been picked, the wafer table may be moved to the expected location of the reference die. A verification process is then performed 2120 to verify that the reference die has been correctly located. As described in more detail above, this may be done using a nine die neighborhood search or other known or later developed verification technique.

As described in more detail with regard to FIG. 15, once the serpentine pick track reaches reference die 106 and its neighborhood, then the pick track may shift to the edge of the wafer opposite the starting point and then pick GEC along a serpentine track back to the reference die. Then, after all of the GEC have been picked, the reference die and its neighborhood may be verified and then picked.

Figure 22:
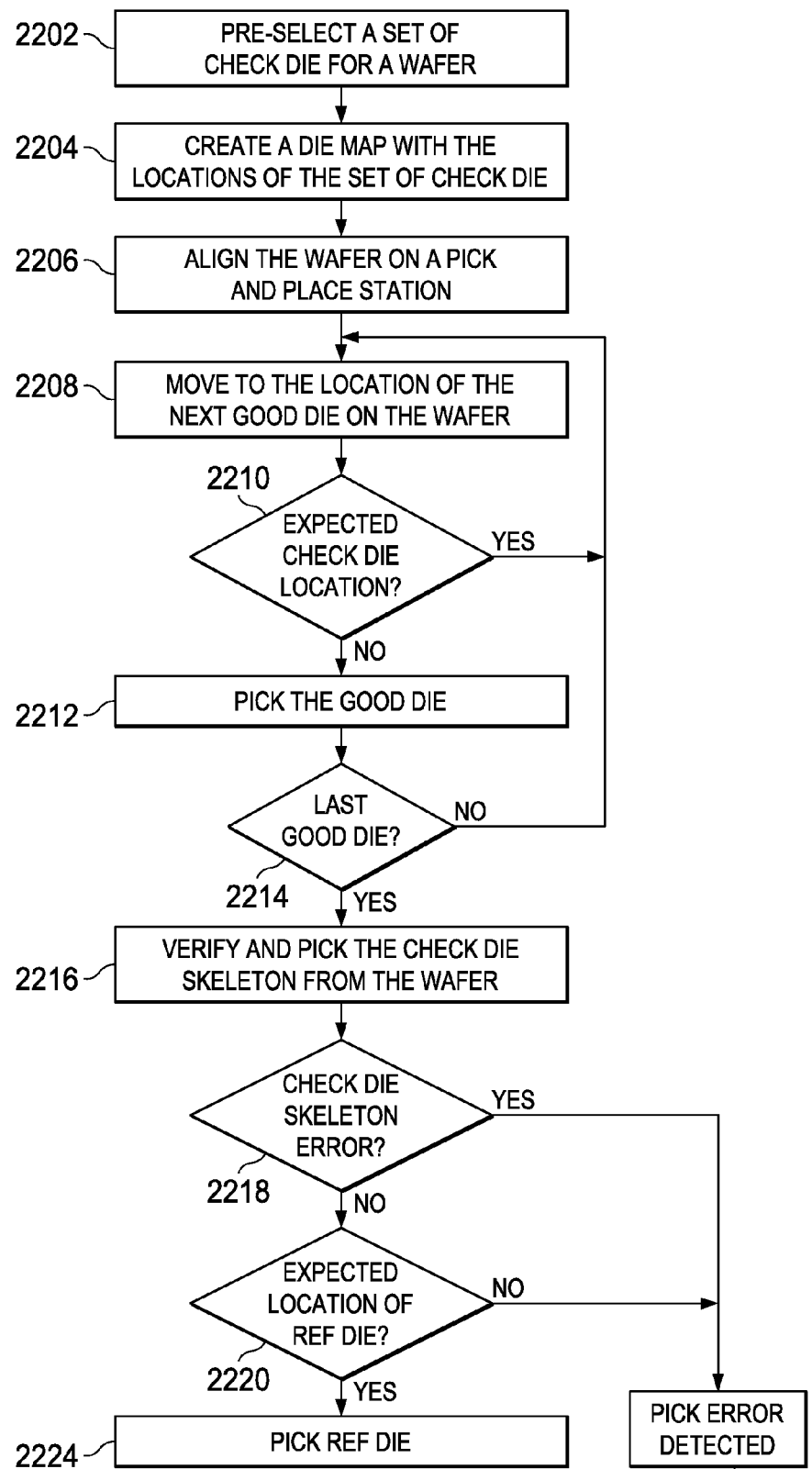
FIG. 22 is a flow diagram illustrating another embodiment of a pick error detection process.

FIG. 22 is a flow diagram illustrating an alternative embodiment of a pick and place process with die attach pick error detection. While picking of the CGEC first before picking of the remaining GEC was described above, in another embodiment the CGEC may be picked last.

As described above with regard to FIGS. 7 and 16-20, a small number of good die are pre-selected 2202 before processing the wafer; these preselected CGEC are intentionally left in place while picking and placing all other good die from the wafer. These pre-selected CGEC die form a check skeleton of die whose locations are known based on the CGEC map and can then be used as alignment features at the end of each lot and/or each wafer. After alignment has been verified on each CGEC die of the CGEC skeleton, it can be picked and mounted, avoiding any loss of yield.

Initially, from good electrical chips (GEC) on a wafer a set of check GEC (CGEC) die is preselected 2202. Typically, this would be done in offline processing using a die map created from pass/fail data provided by a die probe station after probing the wafer. A second die map may be created 2204, or the initial pass/fail map may be augmented to show the locations of the preselected set of CGEC die.

The wafer is then loaded onto a wafer table of a pick and place station and aligned 2206 using a reference die as described in more detail above. Once the wafer is aligned with the pick head, then the wafer table moves 2208 to the first GEC die to be picked. As long the current position is not one of the expected CGEC die locations 2210, the GEC die is picked 2212 and the wafer table moves 2208 to the next GEC die along a preplanned serpentine pack track, as described in more detail above.

When the current location is an expected check die location 2210, then the die is skipped and not picked. The wafer table moves 2208 to the next GEC location along the serpentine track. Once the last GEC die has been picked 2214, the wafer table is then moved along a preplanned track to pick the CGEC die skeleton that is remaining on the wafer. If a "no die present" indication occurs during the picking of the set of CGEC, then it may be assumed that a pick error has occurred and remedial processing needs to be performed on the batch of placed dies. During picking of the check die, if an expected location of a check die is empty 2218, then it may be assumed that an indexing error has occurred and an error 2222 is indicated.

If a known bad die is in a selected CGEC location, it will obviously be left behind. Since it is a bad die, it should not be picked. That means that the checking vision algorithm can still observe that the die is there, where it is expected. A bad die in a CGEC location is not picked after being verified to be in the correct location. Alternatively, when a bad die is located in a selected CGEC location, then the selected CGEC location may be changed to another location during the pre-selection process 2202, for example.

Once the set of CGEC die is picked, the wafer table moves to the expected location of the reference die and performs a nine die neighborhood search or other known or later developed verification technique to verify 2220 that the reference die is at the expected location. If the reference die is verified, then it may be assumed that no pick errors occurred during picking of the batch. If the entire wafer has been picked, then the reference die may be picked 2224 along with its remaining neighborhood. If the reference die location does not verify correctly, then it may be assumed that a pick error has been detected 2222 and remedial processing of the batch is needed.

Multiple Lots on a Wafer

A wafer may contain more than one lot of die. In that case, once a lot is completed, an alignment check may be performed by inspecting the CGEC in the vicinity of the lot that was just completed. For example, referring back to FIG. 20, assume a first lot occupied a portion of die 600, such as for example approximately a third of wafer 600 and a second lot occupies the remaining two thirds of the wafer. Once the wafer map indicates that the end of the first lot has been reached, then an alignment check may be performed by stepping to each of the CGEC die 640 that are adjacent to the portion of the die that contained the first lot. As the location of each check die is reached, the visual system should be able to confirm that the CGEC is still present. Once the CGEC die has been confirmed, then it may be picked. After verifying and picking the CGEC die associated with the completed first lot, processing of the first lot may be completed. Of course, if an error is discovered while verifying the CGEC, then an error is indicated and remedial processing may be performed.

Once the first lot is verified and processing of that lot is closed, then the wafer table may be stepped to the first GEC of the next lot on the wafer to pick and verify it in a manner similar to that described above.

In another embodiment, the CGEC die adjacent the first lot that has been completed may be left until the entire wafer has been processed and then all of the CGEC die may be verified and picked. At that time, the CGEC from the first and second lots may be sorted into different bins.

System Example

Figure 23:
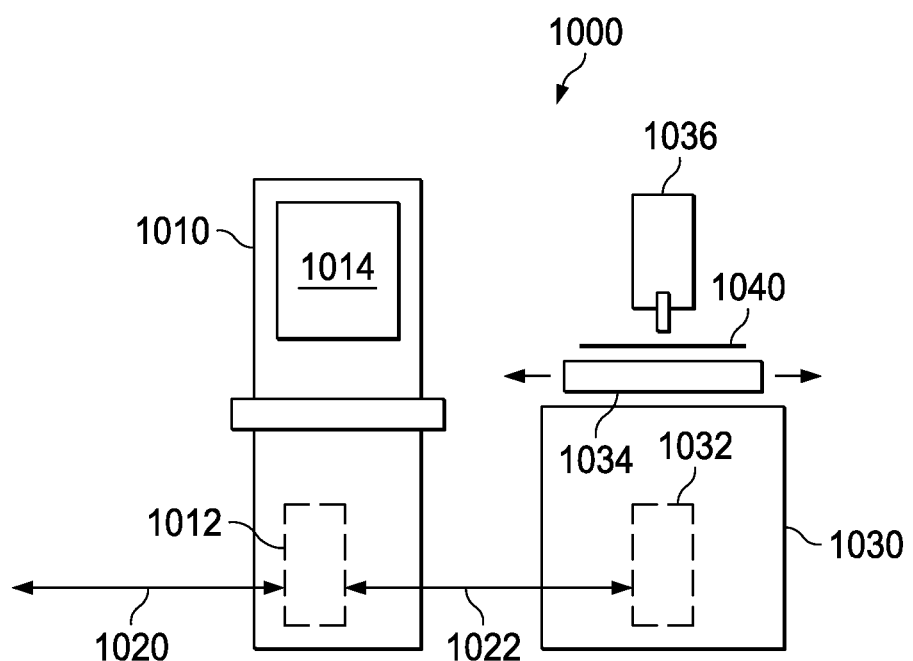
FIG. 23 is a block diagram of an example assembly and test facility that may perform the process of FIGS. 21 and 22.

FIG. 23 is a block diagram of an example assembly and test (A/T) facility 1000 that may perform the process of FIG. 21 or 22. A/T facility 1000 is representative of many currently available and well known or later developed A/T facilities, and therefore need not be described in detail herein. However, A/T facility 1000 will now be described briefly to aid in understanding embodiments of the invention.

Pick and place (P/P) station 1030 supports a wafer table 1034 that is servo-controlled to move in a two dimensional manner with respect to pick assembly 1036. A wafer 104 that is to be processed is placed on wafer table 1034 and moves with it. Pick assembly 1036 is servo-controlled to pick die from a wafer 1040 as the wafer is indexed to position by wafer table 1034. P/P station 1030 may contain control logic 1032 that is operable to control the servo mechanisms.

Control station 1010 may provide an interface for a human operator and may contain a display 1014 along with other interface devices needed by an operator to control P/P station 1030, such as a keyboard, a joystick or similar interface for manually controlling wafer table 1034, actuator buttons, etc, for example. Control station 1010 may contain control electronics 1012 that provide control functions for A/T facility 1000.

Control electronics 1012 may be coupled to control logic 1032 via cable 1022. Control electronics 1012 may also be coupled to other data systems in the production plant via local or wide area network connection 1020. Control electronics 1012 and control logic 1032 may be located in separate cabinets, as illustrated, or may be implemented in a single cabinet local to P/P station 1030 or may be remotely located in another part of the production facility, for example.

As mentioned earlier, an A/T facility, such as A/T facility 1000, may be loaded with a wafer 1040 that then undergoes sawing to singulate the dice. P/P station 1030 then performs pick and place processing based on a wafer map for wafer 1040, as described above. The wafer map specifies the exact location of all good dice and is used to control an accept/reject function of a P/P station 1030. Wafer maps are normally received from offsite locations such as Wafer Fab or Probe sites via network connection 1020. A wafer map is a set of information that is used by process equipment when handling a wafer at its workstation. The map data includes the coordinates of each die on a wafer, bin assignments for good dies and reject dies, wafer orientation or rotation, and the wafer identification that is used to associate the wafer map with the physical wafer, for example The wafer map host system, located in the production facility, receives the map data, provides storage, and enables data download into the production equipment to support processing of wafers to manufacture a semiconductor product. The wafer map host system transforms the lot's wafer map file into a suitable map file for the pick and place equipment to handle and prepares them for equipment download. In the manufacturing floor, as the wafer goes through the assembly process, a barcode may be generated for the wafer identification (ID) and is attached to the wafer or to a carrier frame. When the wafer is ready to be processed at the pick and place equipment, the frame or wafer ID barcode is scanned and is used to request the wafer map from the wafer map host system. P/P station 1030 uses the downloaded wafer map to step to the good chips for pick-up.

Each wafer 1040 contains a plurality of integrated circuit dice. The wafer map identifies the exact location of each die using a coordinate system that corresponds to the physical structure of the wafer. The probe test results (die quality) may be expressed as a single bit value, e.g., good (accept) or bad (reject), or a multiple bit value that provides additional information such as good first grade, good second grade, etc. The wafer map includes a plurality of bin numbers to categorize various attributes and/or properties of each die. For example, bin 1 may contain identification of all good first grade dice, bin 2 may contain identification of all good second grade dice, bin 3 may contain identification of all plug dice, bin 4 may contain identification of all bad dice, and bin 5 may contain identification of all edge bad dice. Each die may be assigned to a particular bin based on the results of the probe testing.

During pick and placing of wafer 1040, A/T system 1000 performs wafer table position verification using a predefined CGEC map for wafer 1040 as described in more detail above. Embodiments of the invention provide a method to detect errors on each manufacturing batch (lot) of material processed during the die attach process. The embodiments may be implemented on current die attach equipment. In this manner, a pick error caused by incorrect wafer table movement may be reliably identified on currently available pick and place machinery by performing the procedures disclosed herein.

Other Embodiments

While the invention has been described with reference to illustrative embodiments, this description is not intended to be construed in a limiting sense. Various other embodiments of the invention will be apparent to persons skilled in the art upon reference to this description.

For example, in another embodiment, a portion of the preselected CGEC may be picked first and alignment checks may be performed using the "no die present" indication as described above. Another portion of the preselected CGEC may be left until after all GEC have been picked to form a CGEC skeleton, and then verified and picked as described above. A location error detected by either process can then be used to flag the lot for further processing.

While only a single reference die 106 was described above, other embodiments may use two or more reference die to allow an extra level of alignment checking. Two reference die may be located on opposites sides of a wafer, for example.

Embodiments of the invention may be applied to various pick & place equipment, including: tape&reel equipment, strip pick&place equipment, etc.

The techniques described in this disclosure may be implemented in hardware, software, firmware, or any combination thereof. If implemented in software, the software may be executed in one or more processors, such as a microprocessor, application specific integrated circuit (ASIC), field programmable gate array (FPGA), or digital signal processor (DSP). The software that executes the techniques may be initially stored in a computer-readable medium such as compact disc (CD), a diskette, a tape, a file, memory, or any other computer readable storage device and loaded and executed in the processor. In some cases, the software may also be sold in a computer program product, which includes the computer-readable medium and packaging materials for the computer-readable medium. In some cases, the software instructions may be distributed via removable computer readable media (e.g., floppy disk, optical disk, flash memory, USB key), via a transmission path from computer readable media on another digital system, etc.

Certain terms are used throughout the description and the claims to refer to particular system components. As one skilled in the art will appreciate, components and processes may be referred to by different names and/or may be combined in ways not shown herein without departing from the described functionality. This document does not intend to distinguish between components that differ in name but not function. In the following discussion and in the claims, the terms "including" and "comprising" are used in an open-ended fashion, and thus should be interpreted to mean "including, but not limited to . . . . " Also, the term "couple" and derivatives thereof are intended to mean an indirect, direct, optical, and/or wireless electrical connection. Thus, if a first device couples to a second device, that connection may be through a direct electrical connection, through an indirect electrical connection via other devices and connections, through an optical electrical connection, and/or through a wireless electrical connection.

Although method steps may be presented and described herein in a sequential fashion, one or more of the steps shown and described may be omitted, repeated, performed concurrently, and/or performed in a different order than the order shown in the figures and/or described herein. Accordingly, embodiments of the invention should not be considered limited to the specific ordering of steps shown in the figures and/or described herein.

It is therefore contemplated that the appended claims will cover any such modifications of the embodiments as fall within the true scope and spirit of the invention.

What is claimed is:

1. A method for detecting a die attach pick error on a semiconductor wafer, the method comprising:

pre-selecting from good electrical chips (GEC) on the wafer a set of check GEC (CGEC) die;

creating a die map with the locations of the set of pre-selected CGEC die on the wafer;
picking the GEC die from the wafer; and
verifying the location of the set of CGEC die during picking of GEC die using the map of the set of pre-selected CGEC, otherwise indicating a pick error when the location of one or more of the CGEC die is not verified.

2. The method of claim 1, wherein the set of CGEC die are picked prior to picking any other CEG; and wherein verifying the location of set of CGEC die comprises:
receiving a "no die" indication when attempting to pick a CGEC die at a current location on the wafer;
verifying the current location on the wafer is an expected location for one of the set of CGEC die according to the die map; and
proceeding to pick another GEC die when the current location is an expected location for one of the set of CGEC die, otherwise indicating an error.

3. The method of claim 2, further comprising performing a neighborhood check around the current location to further verify that the current location is an expected location of one of the set of CGEC die according to the die map.

4. The method of claim 1, wherein the set of CGEC die are picked after picking all other CEG die; and wherein picking the set of CGEC die comprises:
moving to an expected location of one of the set of CGEC die based on the die map;
verifying the presence of a die; and
picking the die if present, otherwise indicating an error.

5. The method of claim 1, wherein the set of CGEC die comprise at least N CGEC die, wherein N is a minimum number based on a yield ratio for the wafer and a probability of detecting a die attach error.

6. The method of claim 1, wherein the set of CGEC are selected to position only one CGEC on at least most of the rows of the wafer.

7. The method of claim 1, wherein the set of CGEC are selected to position the set of CGEC only in two or more columns of the wafer.

8. The method of claim 1, wherein the set of CGEC are selected to position the set of CGEC such that each CGEC is positioned sequentially along a picking track on the wafer with a fixed number (N) of GEC die sequentially positioned between each CGEC.

9. The method of claim 8, wherein N is twenty five.

10. The method of claim 1, wherein the set of CGEC are selected to position the set of CGEC around a perimeter of the wafer.

11. The method of claim 10, wherein the set of CGEC are positioned in a checkerboard manner.

12. The method of claim 1, wherein picking the GEC die from the wafer comprises:
aligning the wafer using a reference die located on the wafer;
moving to an edge of the wafer and picking GEC along a serpentine track until the reference die is again encountered;
moving to an opposite edge of the wafer and picking GEC along a serpentine track until the reference die is again encountered; and
verifying the position of the reference die, otherwise indicating an error.

13. A non-transitory computer-readable medium storing software instructions that, when executed by a processor, cause a method for detecting a die attach pick error on a semiconductor wafer to be performed, the method comprising:
pre-selecting from good electrical chips (GEC) on the wafer a set of check GEC (CGEC) die;
creating a die map with the locations of the set of pre-selected CGEC die on the wafer;
picking the GEC die from the wafer; and
verifying the location of the set of CGEC die during picking of GEC die using the map of the set of pre-selected CGEC, otherwise indicating a pick error when the location of one or more of the CGEC die is not verified.

14. The method of claim 13, wherein the set of CGEC die are picked prior to picking any other CEG; and wherein verifying the location of set of CGEC die comprises:
receiving a "no die" indication when attempting to pick a CGEC die at a current location on the wafer;
verifying the current location on the wafer is an expected location for one of the set of CGEC die according to the die map; and
proceeding to pick another GEC die when the current location is an expected location for one of the set of CGEC die, otherwise indicating an error.

15. The method of claim 14, further comprising performing a neighborhood check around the current location to further verify that the current location is an expected location of one of the set of CGEC die according to the die map.

16. The method of claim 13, wherein the set of CGEC die are picked after picking all other CEG die; and wherein picking the set of CGEC die comprises:
moving to an expected location of one of the set of CGEC die based on the die map;
verifying the presence of a die; and
picking the die if present, otherwise indicating an error.

17. The method of claim 13, wherein the set of CGEC die comprise at least N CGEC die, wherein N is a minimum number based on a yield ratio for the wafer and a probability of detecting a die attach error.

18. The method of claim 13, wherein the set of CGEC are selected to position the set of CGEC such that each CGEC is positioned sequentially along a picking track on the wafer with a fixed number (N) of GEC die sequentially positioned between each CGEC.

19. The method of claim 13, wherein the set of CGEC are selected to position the set of CGEC around a perimeter of the wafer.

20. The method of claim 13, wherein picking the GEC die from the wafer comprises:
aligning the wafer using a reference die located on the wafer;
moving to an edge of the wafer and picking GEC along a serpentine track until the reference die is again encountered;
moving to an opposite edge of the wafer and picking GEC along a serpentine track until the reference die is again encountered; and
verifying the position of the reference die, otherwise indicating an error.

* * * * *